US012626761B2

(12) United States Patent
Hopkins et al.

(10) Patent No.: US 12,626,761 B2
(45) Date of Patent: May 12, 2026

(54) MEMORY CIRCUITRY AND METHOD USED IN FORMING MEMORY CIRCUITRY

(71) Applicant: Micron Technology, Inc., Boise, ID (US)

(72) Inventors: John D. Hopkins, Meridian, ID (US); Alyssa N. Scarbrough, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 731 days.

(21) Appl. No.: 17/897,460

(22) Filed: Aug. 29, 2022

(65) Prior Publication Data

US 2024/0071496 A1    Feb. 29, 2024

(51) Int. Cl.
*G11C 16/04*        (2006.01)
*H10B 41/10*        (2023.01)
(Continued)

(52) U.S. Cl.
CPC ......... *G11C 16/0483* (2013.01); *H10B 41/10* (2023.02); *H10B 41/27* (2023.02);
(Continued)

(58) Field of Classification Search
CPC ........ H10B 43/50; H10B 43/10; H10B 43/27; H10B 41/50; H10B 41/27; H10B 43/35;
(Continued)

(56) References Cited

U.S. PATENT DOCUMENTS 6,144,154 A * 11/2000 Yamazaki ............. H01J 29/028
315/169.3
7,871,909 B1    1/2011 Wang et al.
(Continued)

FOREIGN PATENT DOCUMENTS

EP        3859780        8/2021

OTHER PUBLICATIONS

Handy, "How Samsung Will improve 3D Nand Costs", available online at https://thememoryguy.com/how-samsung-will-improve-3d-nand-costs//#more-1583, Aug. 23, 2017, 2 pages.
(Continued)

*Primary Examiner* — Jessica S Manno
*Assistant Examiner* — Victor Joseph Lasasso
(74) *Attorney, Agent, or Firm* — Wells St. John P.S.

(57)        ABSTRACT

Memory circuitry comprising strings of memory cells comprises a stack comprising vertically-alternating insulative tiers and conductive tiers. Channel-material strings of memory cells extend through the insulative tiers and the conductive tiers in a memory-array region. The insulative tiers and the conductive tiers extend from the memory-array region into a stair-step region. The stair-step region comprises a cavity comprising a flight of stairs extending along a first direction. Multiple different-depth and height-sequential treads in individual of the stairs extend along a second direction that is orthogonal to the first direction. Individual of the multiple different-depth treads comprise conducting material of one of the conductive tiers. The cavity comprises a pair of laterally-opposing outermost sidewalls relative to the second direction and that individually extend along the first direction. The multiple different-depth and height-sequential treads in the individual stairs comprise a single flight of said treads that extends along the second direction from one of the laterally-opposing outermost sidewalls to the other of the laterally-opposing outermost sidewalls. Methods are disclosed.

22 Claims, 33 Drawing Sheets

(51) Int. Cl.

| | |
|---|---|
| *H10B 41/27* | (2023.01) |
| *H10B 41/35* | (2023.01) |
| *H10B 43/10* | (2023.01) |
| *H10B 43/27* | (2023.01) |
| *H10B 43/35* | (2023.01) |

(52) U.S. Cl.
CPC .............. *H10B 41/35* (2023.02); *H10B 43/10* (2023.02); *H10B 43/27* (2023.02); *H10B 43/35* (2023.02)

(58) Field of Classification Search
CPC ........ H10B 43/40; H10B 41/35; H10B 41/41; H10B 43/20; H01L 23/5226; H01L 21/76877; H01L 21/0335; H01L 21/31116; H01L 21/31144; H01L 21/32139; H01L 21/76831; H01L 23/5283; H01L 21/76816; H10D 30/0411; H10D 30/689; H10D 30/69; H10D 88/00
See application file for complete search history.

(56) References Cited

U.S. PATENT DOCUMENTS

| | | |
|---|---|---|
| 10,211,154 B2 | 2/2019 | Lee et al. |
| 10,431,273 B2 | 10/2019 | Futatsuyama |
| 10,629,614 B2 | 4/2020 | Oh |
| 2010/0207186 A1 | 8/2010 | Higashi et al. |

| | | | |
|---|---|---|---|
| 2014/0273462 A1* | 9/2014 | Simsek-Ege | ........ H01L 21/0335 |
| | | | 438/696 |
| 2015/0028410 A1* | 1/2015 | Kato | ...................... H10B 43/27 |
| | | | 438/586 |
| 2016/0276262 A1* | 9/2016 | Ishimura | ........... H01L 21/76805 |
| 2018/0323199 A1 | 11/2018 | Roberts et al. | |
| 2019/0206726 A1* | 7/2019 | Williamson | ...... H01L 21/76816 |
| 2019/0319040 A1 | 10/2019 | Ishill et al. | |
| 2020/0127001 A1 | 4/2020 | Hua et al. | |
| 2020/0303392 A1 | 9/2020 | Hua et al. | |
| 2021/0057442 A1 | 2/2021 | Zhang et al. | |
| 2021/0257220 A1 | 8/2021 | Liu et al. | |
| 2021/0272900 A1 | 9/2021 | Shin | |

OTHER PUBLICATIONS

Hopkins et al., U.S. Appl. No. 17/897,350, filed Aug. 29, 2022, titled "Memory Circuitry and Method Used in Forming Memory Circuitry", 63 pages.

Hopkins et al., U.S. Appl. No. 17/897,399, filed Aug. 29, 2022, titled "Memory Circuitry and Method Used in Forming Memory Circuitry", 58 pages.

Hopkins et al., U.S. Appl. No. 17/897,516, filed Aug. 29, 2022, titled "Memory Circuitry and Method Used in Forming Memory Circuitry", 68 pages.

Wang, "3D Nand: Challenges Beyond 96-Layer Memory Arrays", available online at https://semiengineering.com/3d-nand-challenges-beyond-96-layer-memory-arrays/, Oct. 24, 2018, 11 pages.

* cited by examiner

FIG. 1

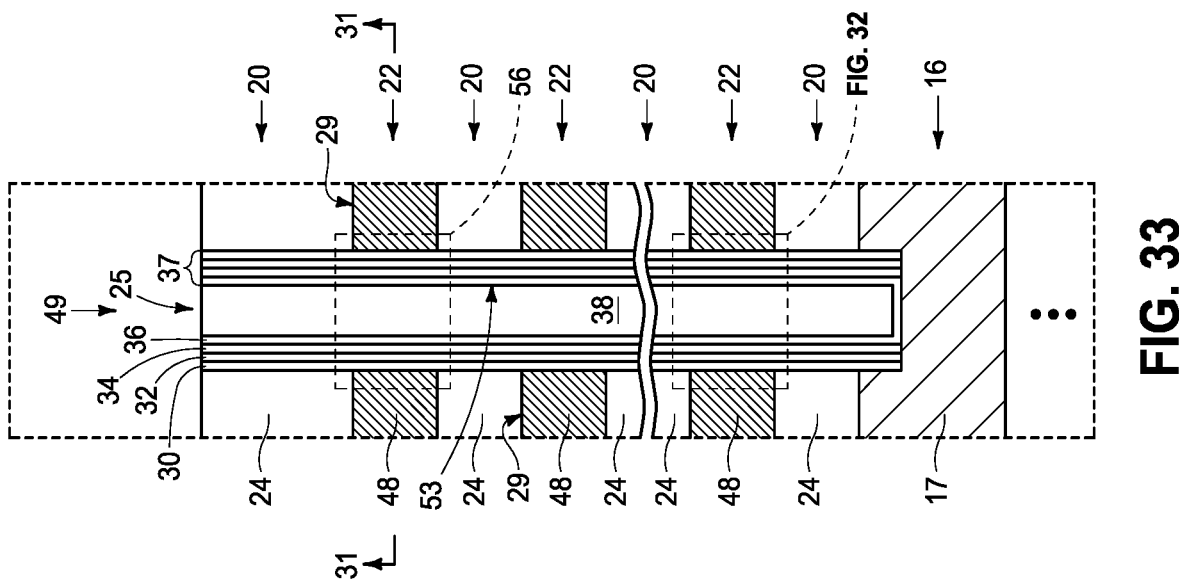
FIG. 31
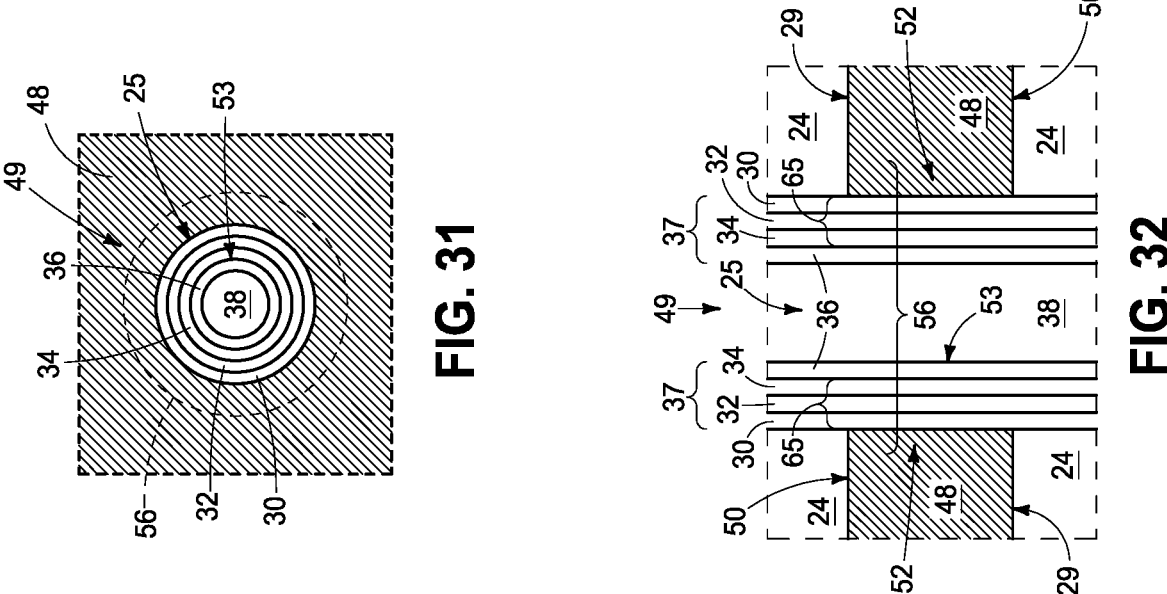
FIG. 32
FIG. 33

MEMORY CIRCUITRY AND METHOD USED IN FORMING MEMORY CIRCUITRY

TECHNICAL FIELD

Embodiments disclosed herein pertain to memory circuitry and to methods used in forming memory circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIG. 1 is a diagrammatic view of a portion of memory circuitry in process in accordance with embodiments of the invention.

FIG. 3 is a diagrammatic cross-sectional view taken through line 3-3 in FIG. 1.

FIGS. 2 and 4-39 are diagrammatic sectional, expanded, enlarged, and/or partial views of the construction of FIGS. 1-3 or portions thereof, and/or of alternate embodiments.

DETAILED DESCRIPTION OF EXAMPLE EMBODIMENTS

Embodiments of the invention encompass methods used in forming integrated circuitry, for example memory circuitry comprising a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass integrated circuitry such as that comprising a memory array comprising strings of memory cells (e.g., NAND architecture) independent of method of manufacture. Some example embodiments are described with reference to FIGS. 1-39.

Figure 6:
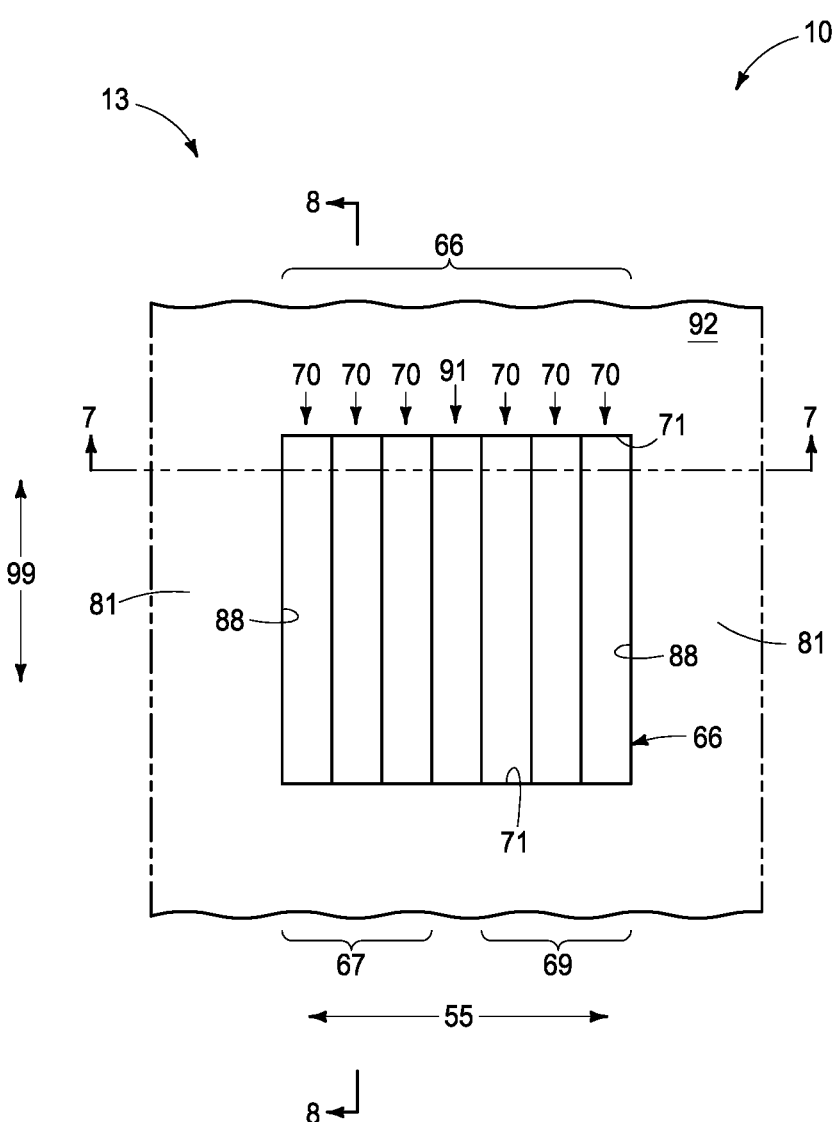
Figure 7:
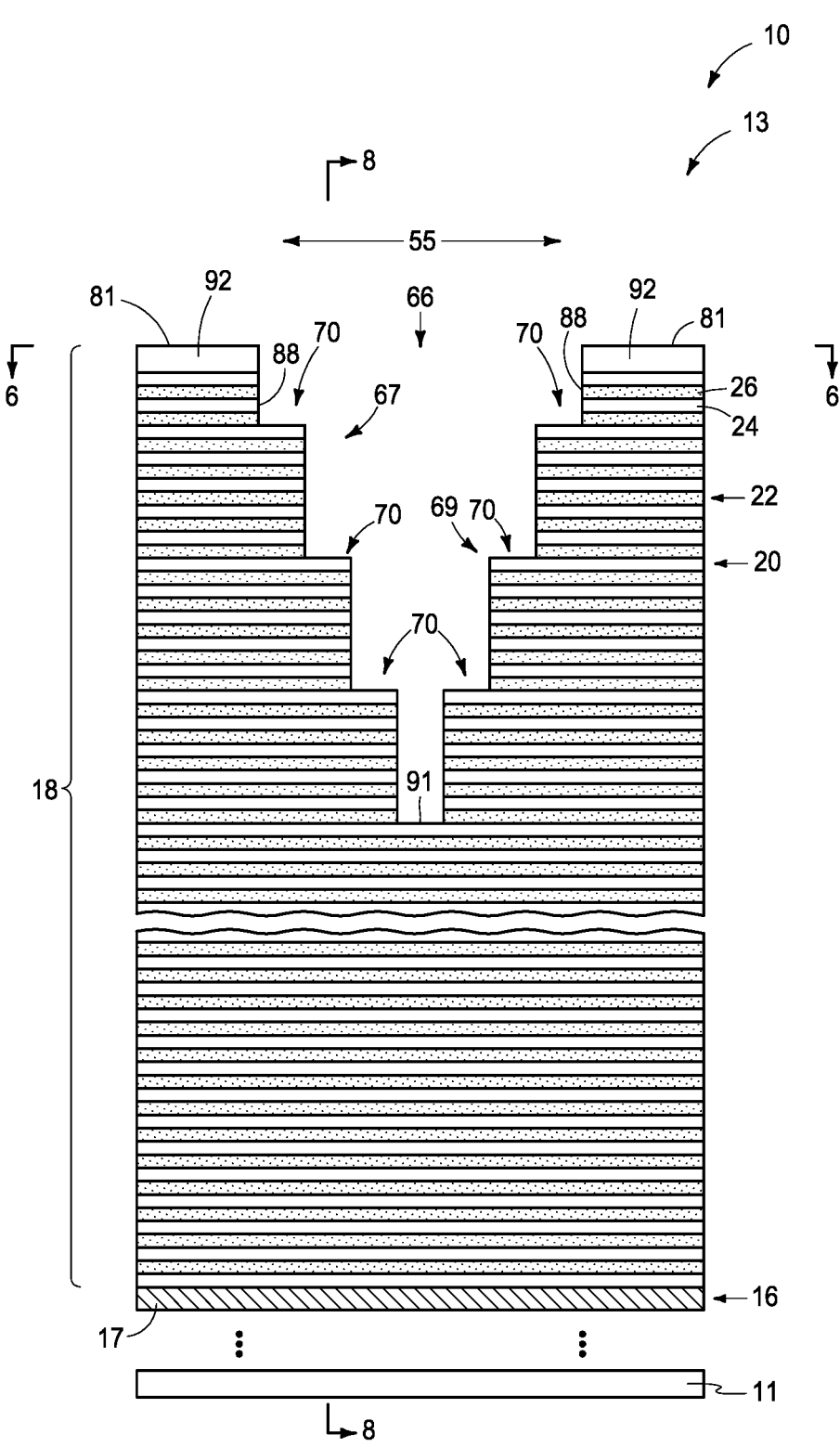
Figure 8:
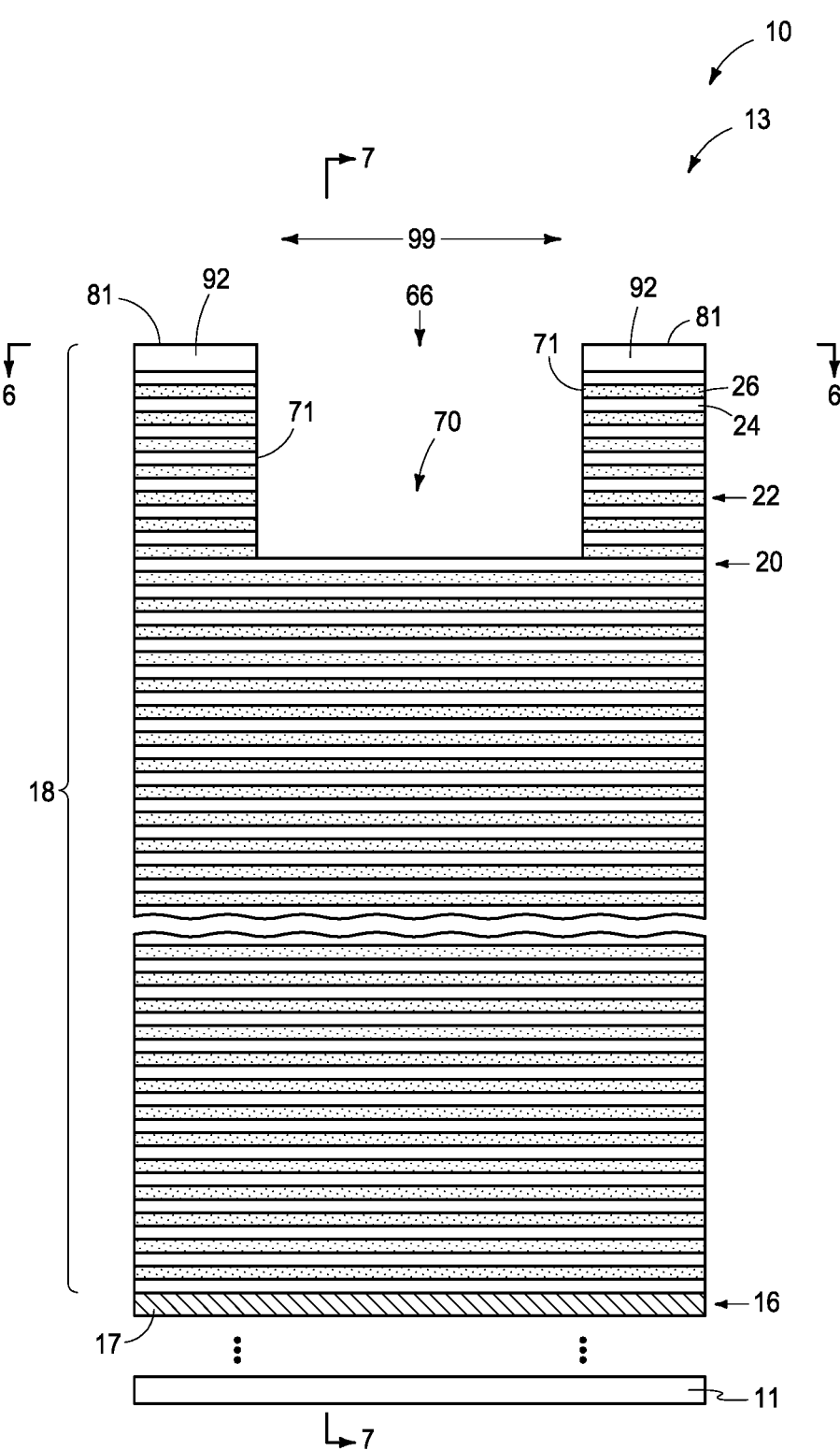

FIGS. 1-8 show an example construction 10 having two memory-array regions 12 in which elevationally-extending strings of transistors and/or memory cells will be formed. The two memory-array regions 12 may be of the same or different constructions relative one another. In one embodiment, a stair-step region 13 is between memory-array regions 12 and comprises stair-step structures as described below. Alternately, by way of example, a stair-step region may be at the end of a single memory-array region (not shown). FIGS. 6-8 are of different and varying scales compared to FIGS. 1-5 for clarity in disclosure more pertinent to stair-step region 13 than to memory-array regions 12. Example construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-8-depicted materials. For example, other partially or wholly fabricated components of integrated circuitry may be provided somewhere above, about, or within base substrate 11. Control and/or other peripheral circuitry for operating components within an array (e.g., individual array regions 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 (e.g., WSi$_x$ under conductively-doped polysilicon) is above substrate 11. Conductor tier 16 may comprise part of control circuitry (e.g., peripheral-under-array circuitry and/or a common source line or plate) used to control read and write access to the transistors and/or memory cells in array 12. A vertical stack 18 comprising vertically-alternating insulative tiers 20 and conductive tiers 22 is directly above conductor tier 16 and extends from memory-array region 12 into stair-step region 13. In some embodiments, conductive tiers 22 may be referred to as first tiers 22 and insulative tiers 20 may be referred to as second tiers 20, with first tiers 22 being conductive and second tiers 20 being insulative at least in a finished-circuitry construction. Example thickness for each of tiers 20 and 22 is 20 to 60 nanometers. The example uppermost tier 20 may be thicker/thickest compared to one or more other tiers 20 and/or 22. Example first tiers 22 comprise material 26 (e.g., silicon nitride) and example second tiers 20 comprise material 24 (e.g., silicon dioxide). Only a small number of tiers 20 and 22 is shown in FIGS. 2-5 and other figures, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22 (not shown). Alternately or additionally, at least one of the depicted uppermost and lowest conductive tiers 22 may be a select gate tier.

Channel openings 25 have been formed (e.g., by etching) through insulative tiers 20 and conductive tiers 22 to conductor tier 16. Channel openings 25 may taper radially-inward and/or radially-outward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to conductor material 17 of conductor tier 16 is to assure direct electrical coupling of channel material to conductor tier 16 without using alternative processing and structure to do so when such a connection is desired and/or to provide an anchoring effect to material that is within channel openings 25. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row and being arrayed in laterally-spaced memory-block regions 58 that will comprise laterally-spaced memory blocks 58 in a finished-circuitry construction. In this document, "block" is generic to include "sub-block". Memory-block regions 58 and resultant memory blocks 58 (not yet shown) may be considered as being longitudinally elongated and oriented, for example along a first direction 55, with a second direction 99 being orthogonal thereto. Any alternate existing or future-developed arrangement and construction may be used.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

The figures show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18 and within individual channel openings 25 followed by planarizing such back at least to a top surface of stack 18 as shown.

Channel material 36 has also been formed in channel openings 25 elevationally along insulative tiers 20 and conductive tiers 22 and comprise individual channel-material strings 53 in one embodiment having memory-cell materials (e.g., 30, 32, and 34) there-along and with material 24 in insulative tiers 20 being horizontally-between immediately-adjacent channel-material strings 53. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 (channel-material string 53) is directly electrically coupled with conductor material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled with conductor material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space (s) (not shown) and/or be devoid of solid material (not shown).

Figure 1:
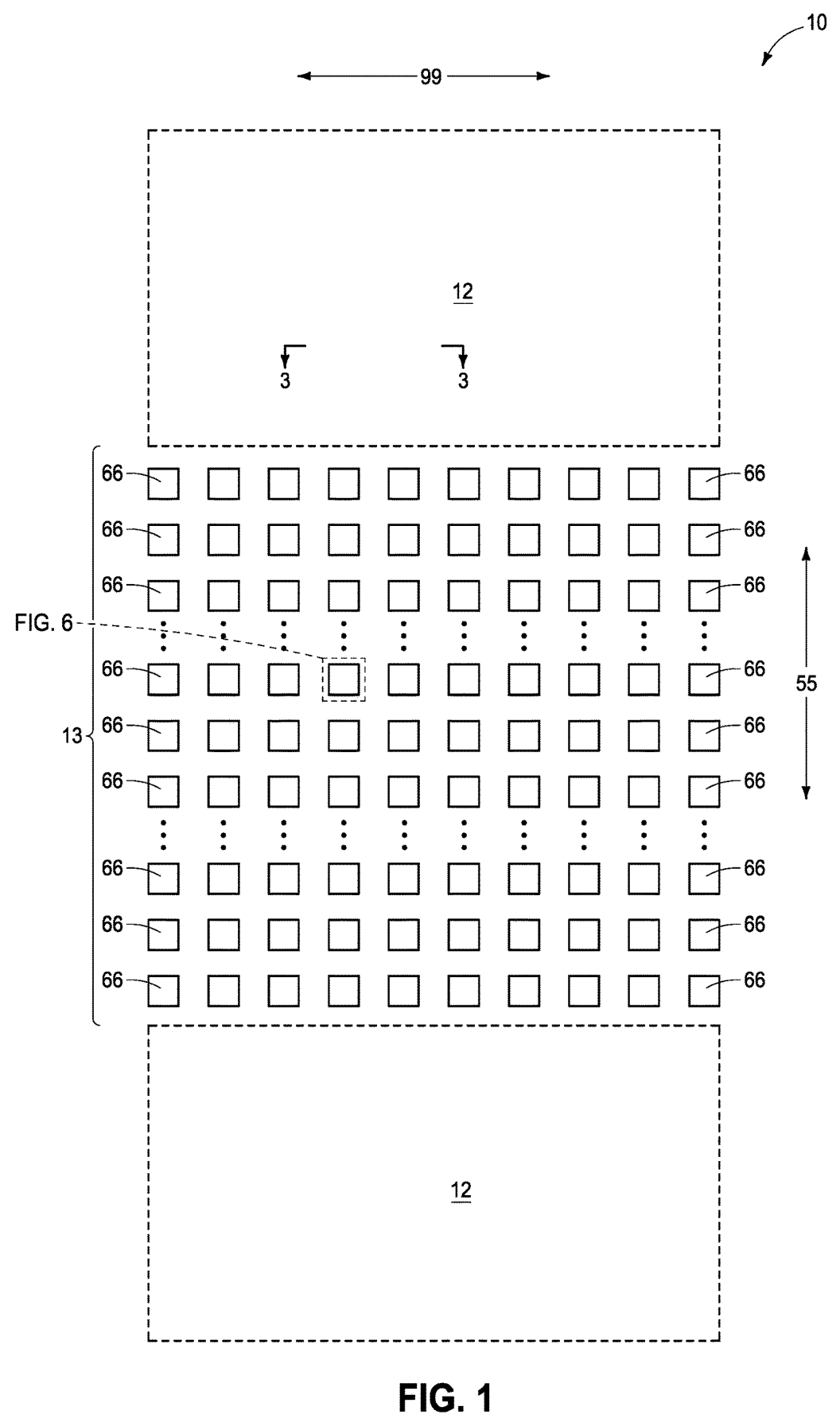
Figures 2, 3:
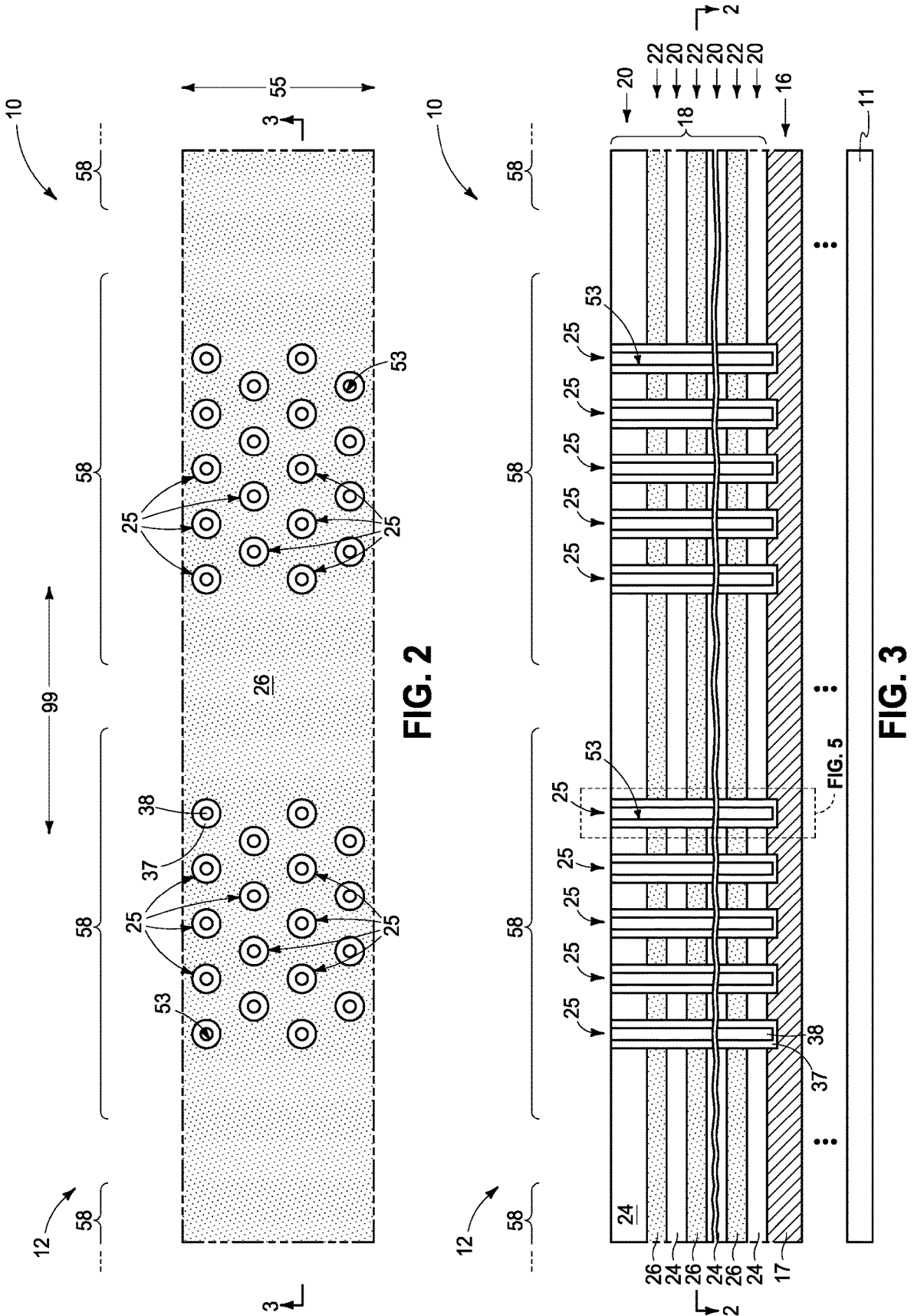
Figures 4, 5:
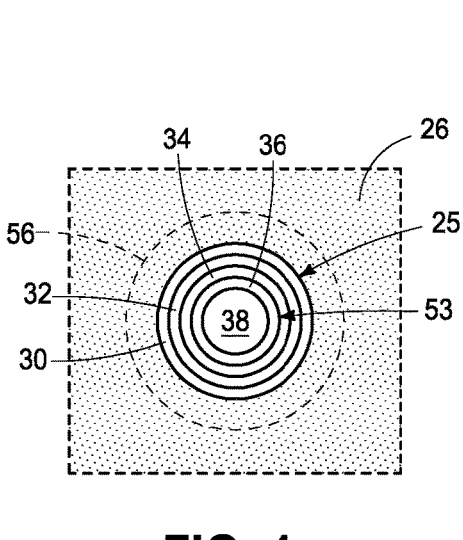

Referring to FIGS. 1 and 6-8, and in one embodiment, an array of cavities 66 has been formed in stair-step region 13 and that individually comprise a stair-step structure as described below. Example cavities 66 are aligned longitudinally end-to-end in individual memory-block regions 58 and have a crest 81 between immediately-adjacent cavities 66. Alternately, only a single cavity may be in individual memory-block regions 58 (not shown). Nevertheless, method and structure embodiments include fabrication of and a resultant construction having only a single cavity 66 and the discussion largely proceeds with respect to a single cavity 66. Cavities 66 are shown as being quadrilateral in horizontal cross-section, although other quadrilateral or non-quadrilateral shapes may be used and all need not be of the same shape relative one another. For brevity, less tiers 20 and 22 are shown in FIGS. 3 and 5 as compared to FIGS. 7 and 8, with more tiers 20 and 22 being shown in FIGS. 7 and 8 for clarity and for better emphasis of cavities 66 and processing/aspects associated therewith. A masking material 92 (e.g., sacrificial) of different composition from that of materials 24 and 26 may be atop/as-part-of stack 18 and through which cavities 66 have been formed.

Cavities 66 individually comprise a flight 67 or 69 of stairs 70 in a first vertical cross-section (e.g., that of FIG. 7) along a first direction (e.g., 55). Flights 67 and 69 with a landing 91 there-between comprise a stair-step structure. Example flights 67 and 69 oppose (e.g., face toward) one another in cavity 66. Landing 91 may be considered as being a stair 70 of either flight 67 or 69 (not so-designated). Cavity 66 with flights 67 and 69 may be formed by any existing or later-developed method(s). As one such example, a masking material (e.g., a photo-imagable material such as photoresist) may be formed atop stack 18 and an opening formed there-through. Then, the masking material may be used as a mask while etching (e.g., anisotropically) through the opening to extend such opening into at least two outermost tiers 20, 22. The resultant construction may then be subjected to a successive alternating series of lateral-trimming etches of the masking material followed by etching deeper into stack 18, two tiers 20, 22 at a time (at least two), using the trimmed masking material having a successively widened opening as a mask. Such an example may result in the forming of flight 67 into stack 18 that comprises vertically alternating tiers 20, 22 of different composition materials 24, 26, and in the forming of another flight 69 opposite and facing toward flight 67 (e.g., in mirror-image and as shown). Likely more stairs 70 will be in flights 67 and/or 69 than shown. Example stairs 70 in stack 18 are individually shown as comprising five pairs of second tiers 20 over first tiers 22 (e.g., the order of which may be reversed). Fewer or more first and second tiers per stair 70 may be used, for example if forming a different number of treads per stair than five as will be shown in subsequent figures (e.g., along second direction 99 and not shown). Example flights 67 and 69 in example cavity 66 are optionally shown as starting two pairs of second tiers 20 over first tiers 22 down from the top of stack 18. First tiers 22 in such two pairs may be used for select gates (e.g., select gate drains).

In one example, one of two opposing flights 67 and 69 is operative (e.g., flight 67) and the other of two opposing flights 67 and 69 is dummy (e.g., flight 69) in the finished-circuitry construction. In this document, a flight that is "dummy" is circuit-inoperative having stairs thereof in which no current flows in conductive material of the steps and which may be a circuit-inoperable dead end that is not part of a current flow path of a circuit even if extending to or from an electronic component. When inoperative, position of operative vs. inoperative relative to flights 67 and 69 may of course be reversed. Multiple operative flights and multiple dummy flights may be formed in multiple cavities 66, for example longitudinally end-to-end as shown and to different depths within stack 18. Pairs of opposing mirror-image operative and dummy flights may be considered as defining a stadium (e.g., a vertically recessed portion having opposing flights of stairs as shown). Alternately, only a single flight 67 or 69 may be formed (not shown) in one or more individual cavities 66. Regardless, cavities 66 may be formed before or after forming channel-material strings 53. Cavities 66 may be considered as having laterally-outermost sidewalls 71 (relative to second direction 99) and 88 (relative to first direction 55), with the risers (not numerically designated) that are part of individual stairs 70 along with sidewalls 88 effectively being part of the sidewalls of cavities 66 that are along second direction 99, with sidewalls 71 being along first direction 55. Sidewalls 71, 88 and/or the risers may taper laterally-inward or outward moving deeper into stack 18 (not shown).

FIGS. 9-13 are a series of figures showing example sequential formation of different-composition first and second spacers 93 and 94, respectively, in cavity 66 and that extend along first direction 55 directly above the flight (67 and/or 69) of stairs 70. First and second spacers 93 and 94 alternate relative one another along second direction 99. FIGS. 9-13 are vertical cross-sections taken along the same line 8-8 in FIG. 6 and accordingly are sequential to the construction shown by FIG. 8.

Figure 9:
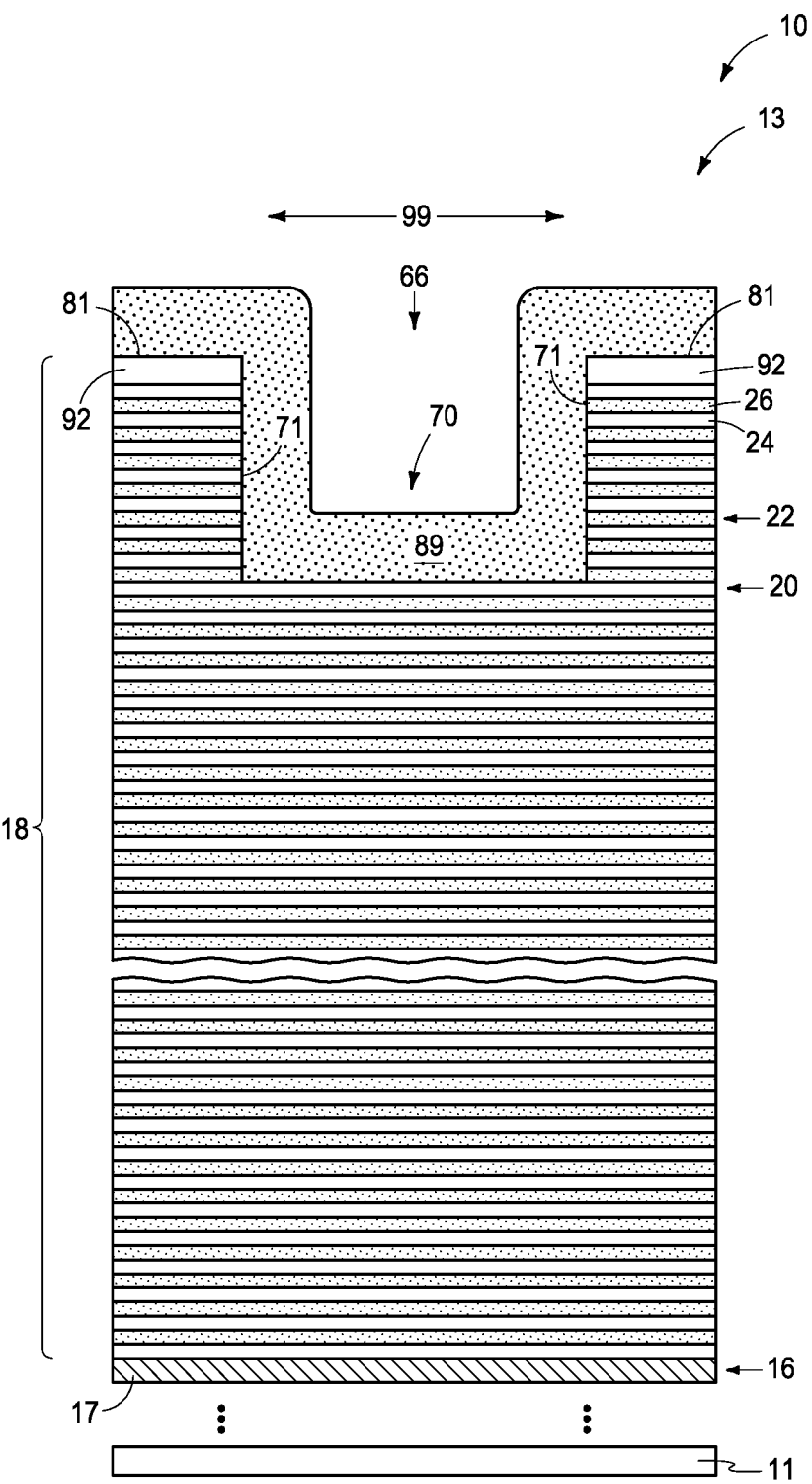
Figure 10:
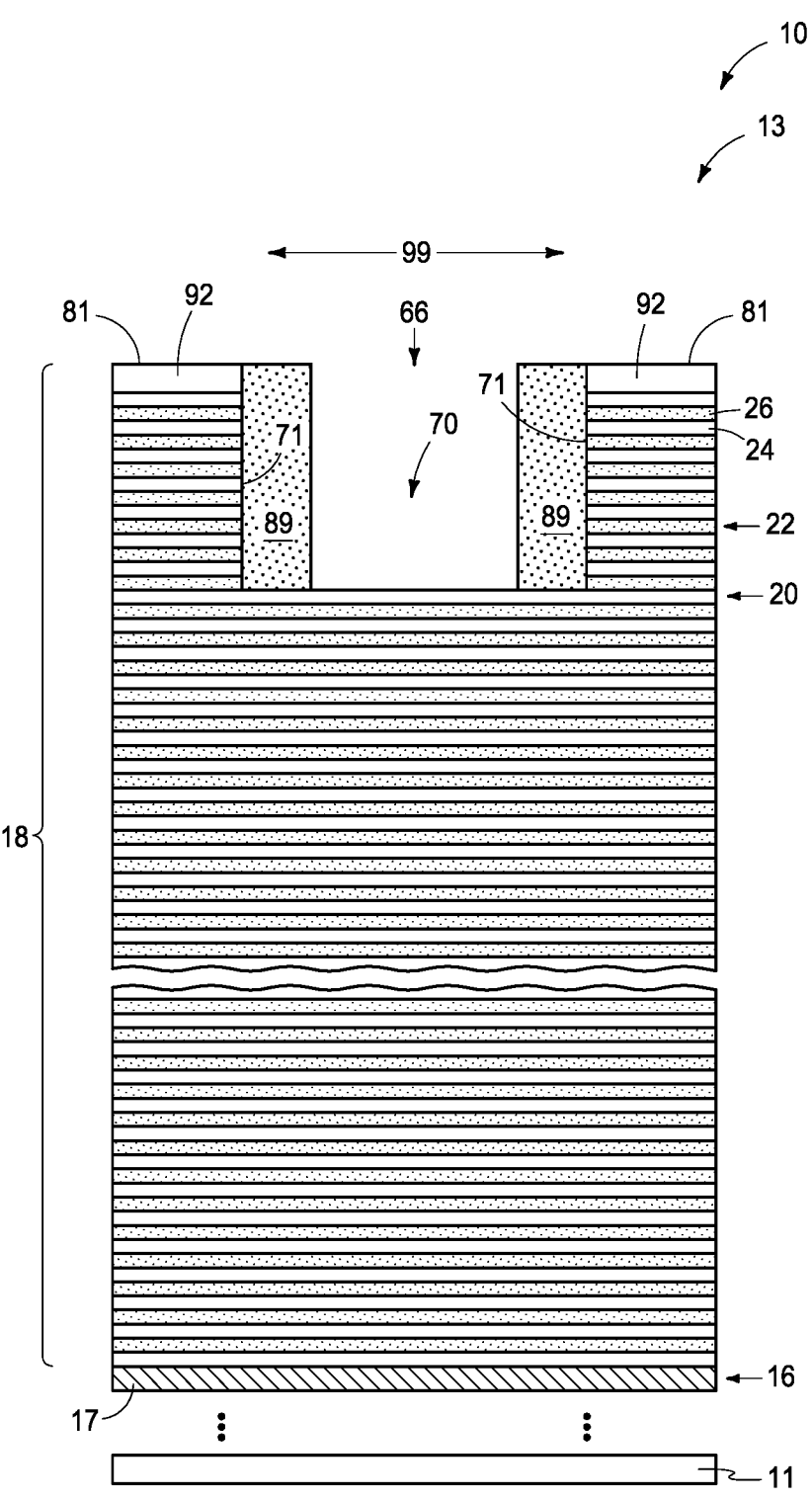
Figure 11:
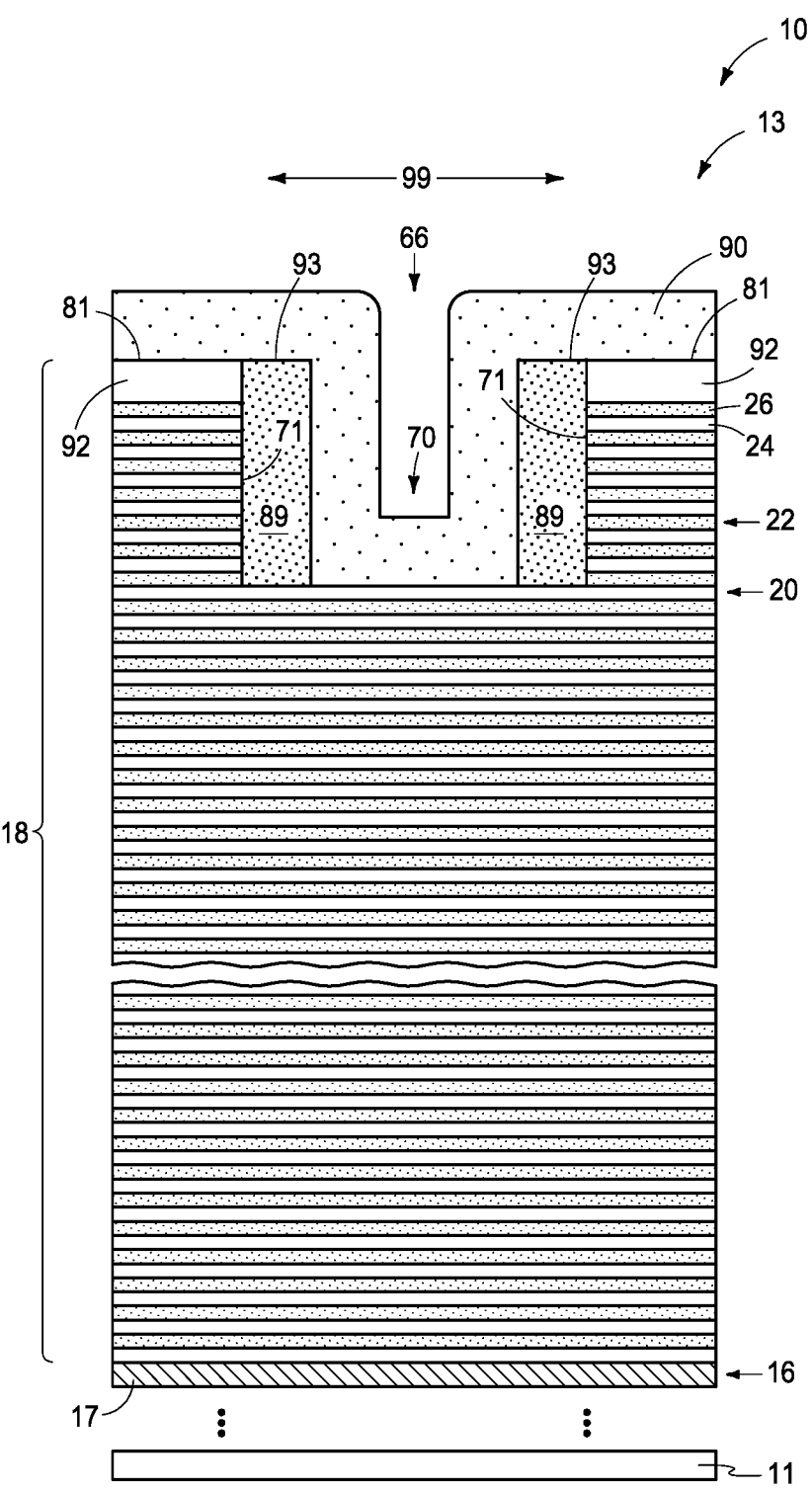
Figure 12:
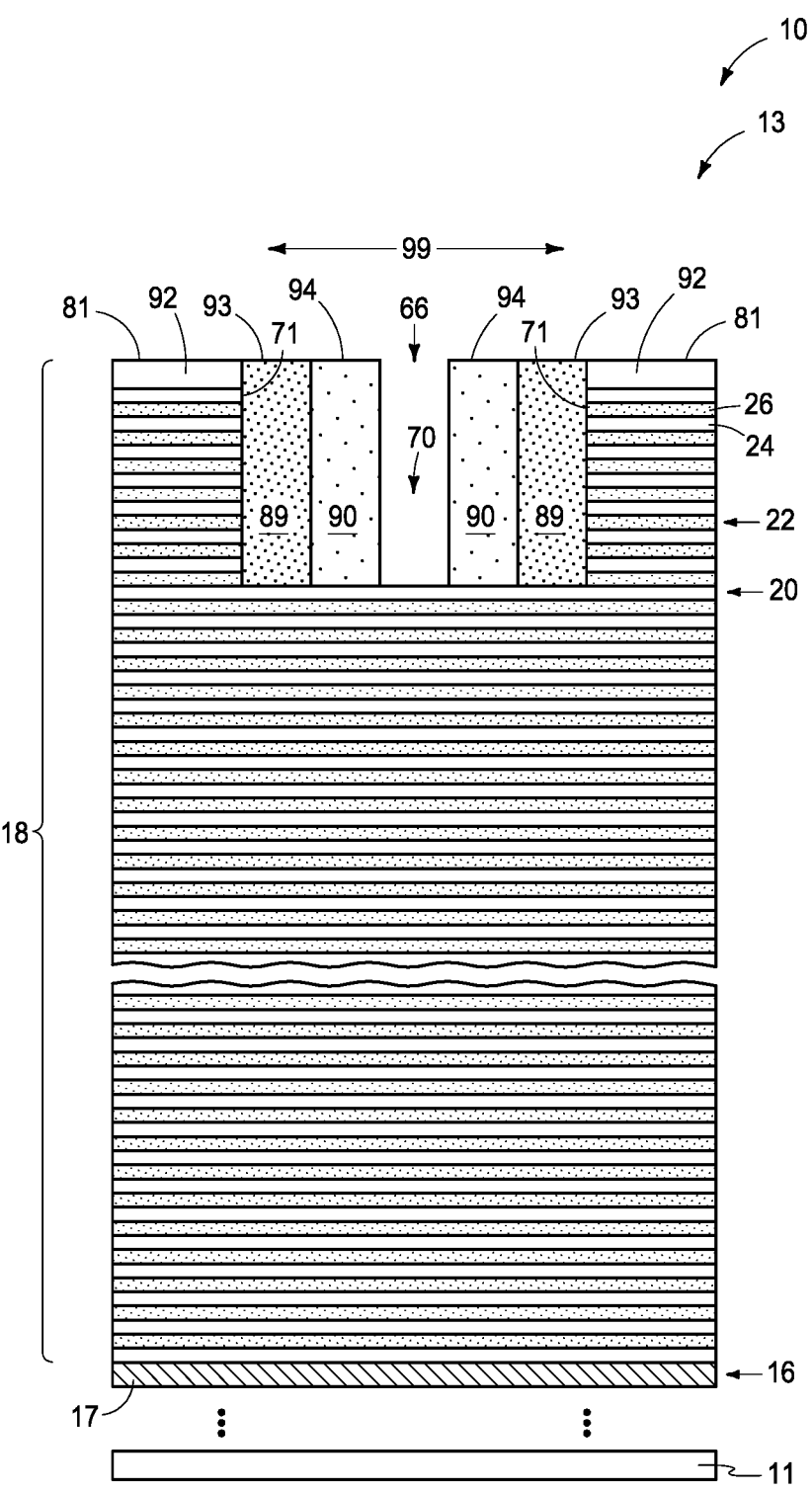
Figure 13:
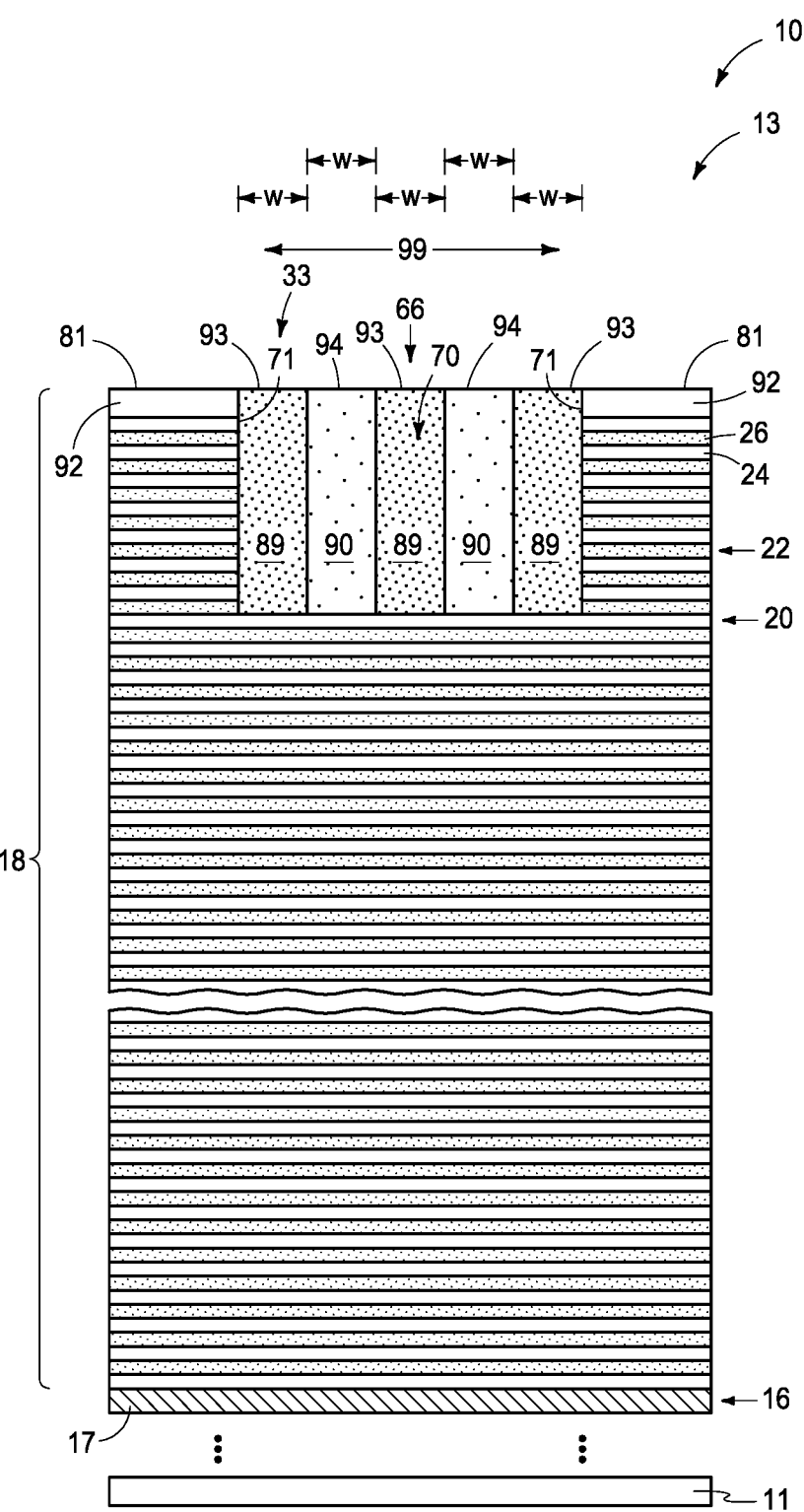

FIG. 9 shows formation of a spacer-forming layer 89 above and within cavity 66. FIG. 10 shows anisotropic etching of spacer-forming layer 89 above and within cavity 66 to form first spacers 93. FIG. 11 shows formation of a spacer-forming layer 90 above and within cavity 66, with spacer-forming layer 90 being of different composition from that of spacer-forming layer 89. FIG. 12 shows anisotropic etching of spacer-forming layer 90 above and within cavity 66 to form second spacers 94. FIG. 13 shows formation of another first spacer 93 laterally-between second spacers 94 (e.g., by deposition of material of such another first spacer 93 to fill the space between second spacers 94 followed by planarizing such back to the top surface of second spacers 94 such that none of such material of such another first spacer 93 is anisotropically etched within cavity 66). Accordingly, and in one embodiment, forming at least some of the different-composition first and second spacers comprises forming a spacer-forming layer (e.g., 89 or 90) above and within the cavity and anisotropically etching the spacer-forming layer above and within the cavity. In one such embodiment, less-than-all of the spacers are formed by anisotropically etching the respective spacer-forming layer within the cavity (e.g., center first spacer 93 not being so-formed). In one such latter embodiment and as shown, a majority of the collective first and second spacers (e.g., all but center first spacer 93) is formed by the anisotropically etching of the respective spacer-forming layer within the cavity.

In one embodiment, each of the different compositions first and second spacers 93 and 94 is different from those of first tiers 22 and second tiers 20. In one embodiment, one of the different compositions is carbon and in one embodiment one of the different compositions is polysilicon (including one embodiment where one is carbon and the other is polysilicon). In one embodiment and as shown, total number of alternating first and second spacers 93 and 94 in cavity 66 is five. In one embodiment, first and second spacers 93 and 94, are of the same lateral-width W in second direction 99.

Figure 14:
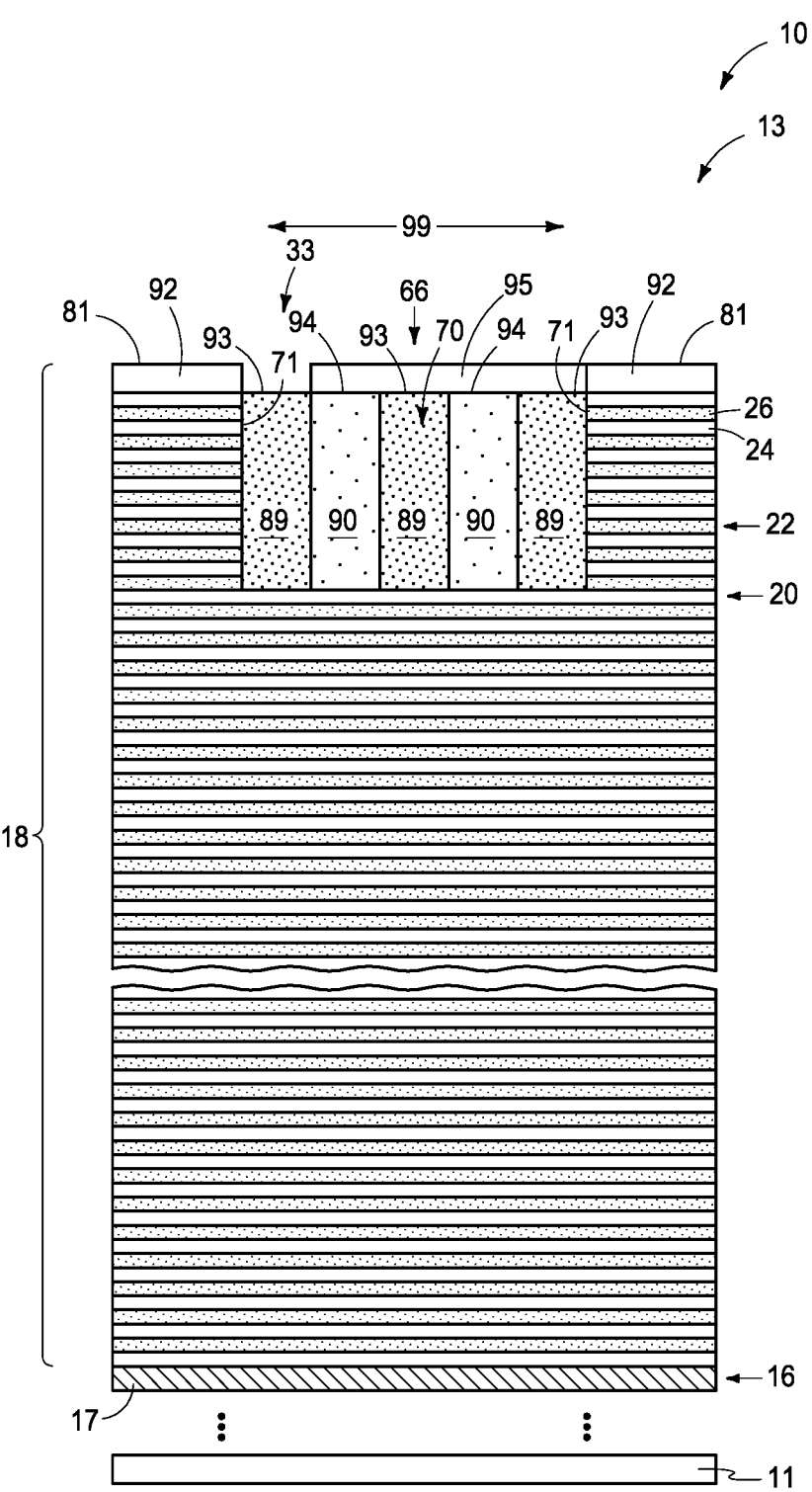
Figure 15:
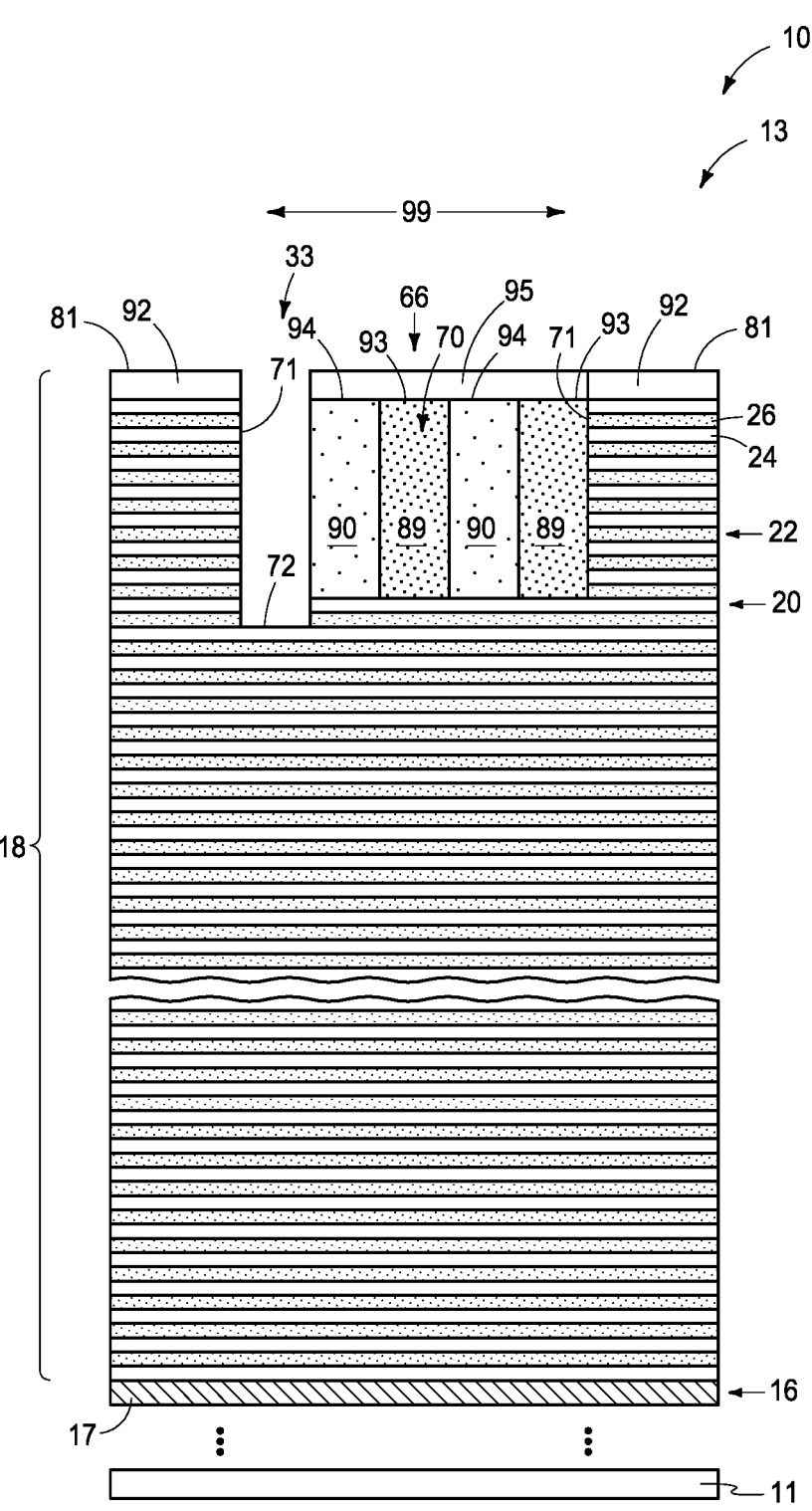
Figure 16:
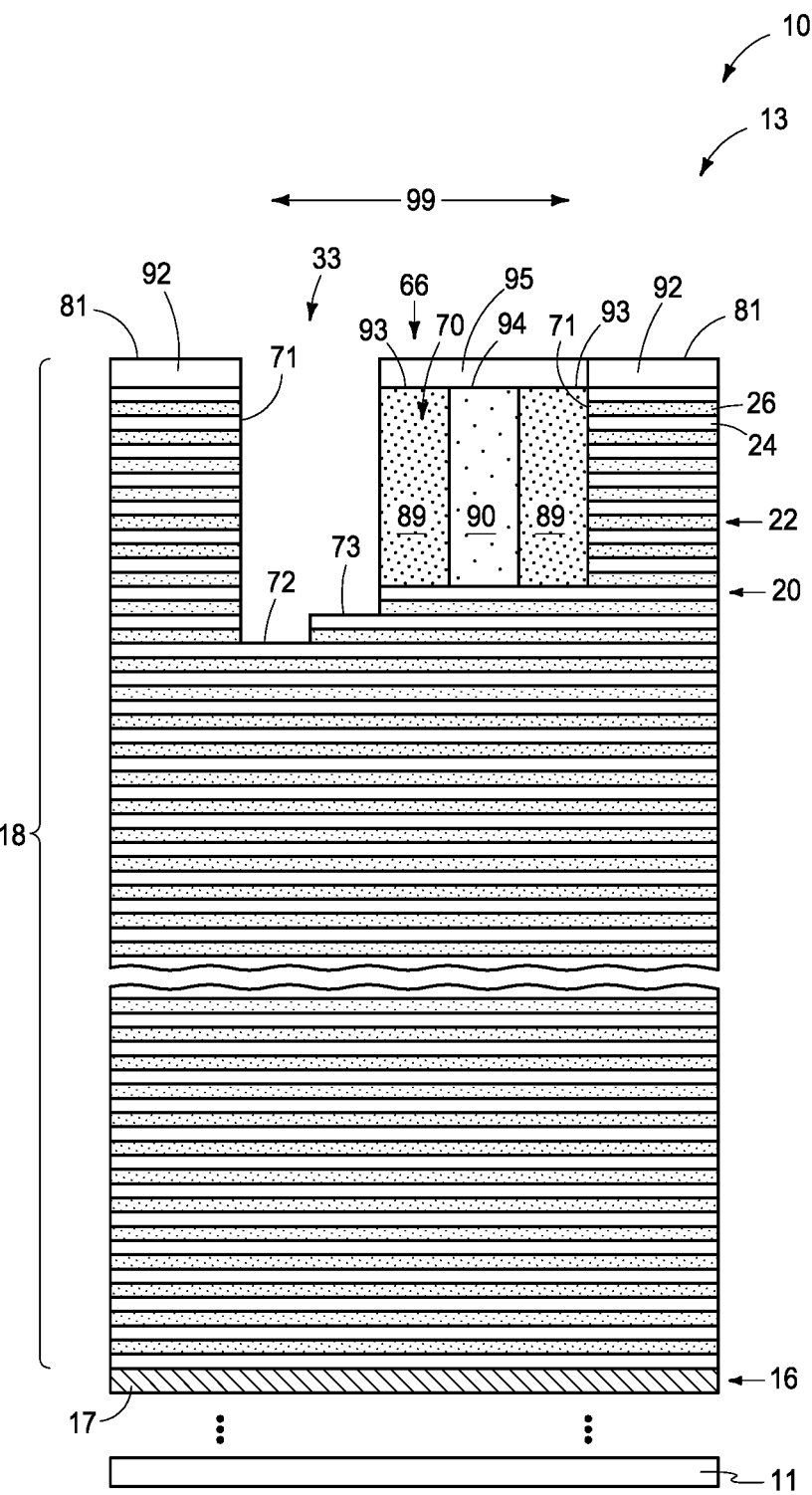
Figure 17:
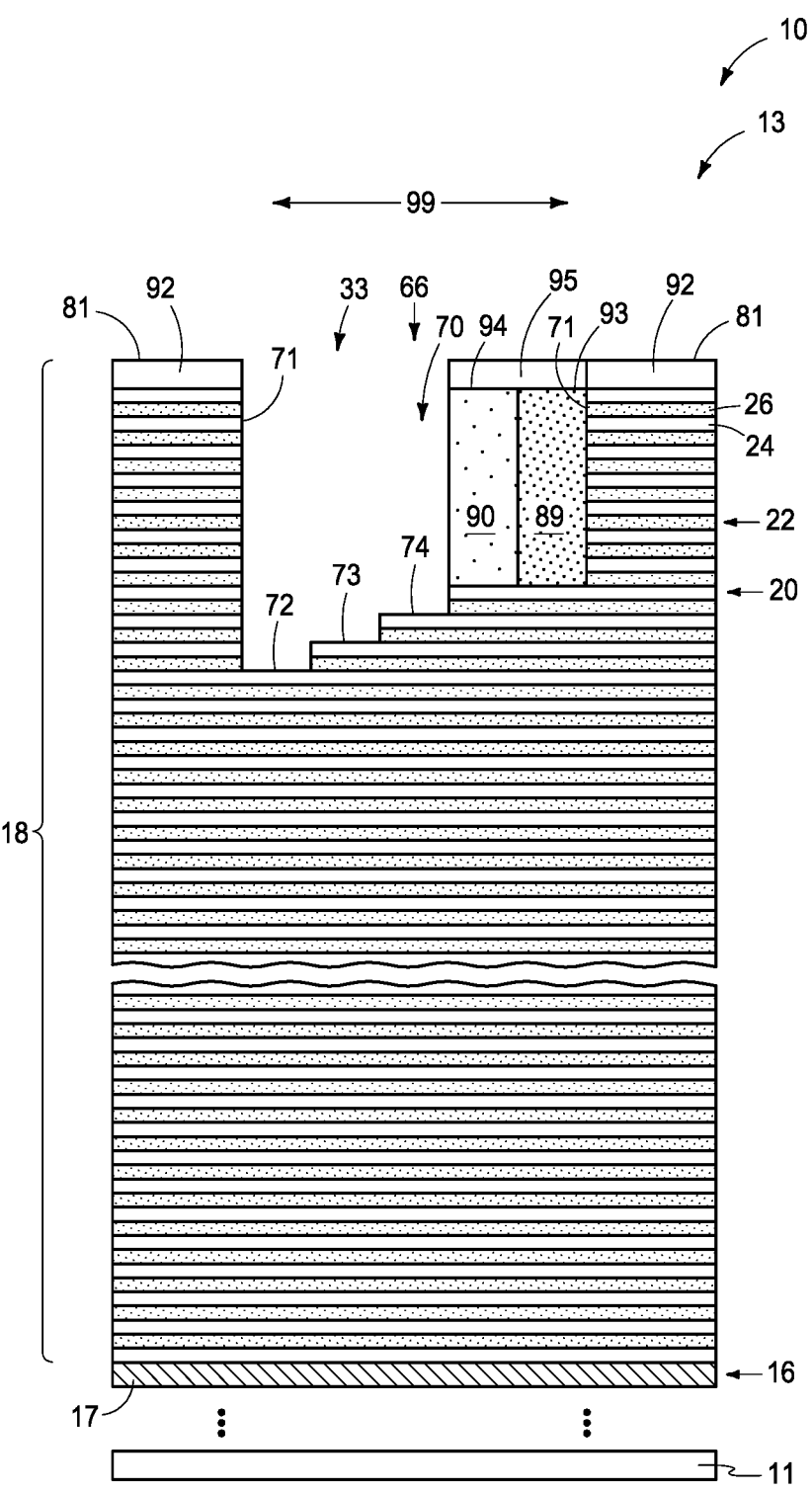
Figure 18:
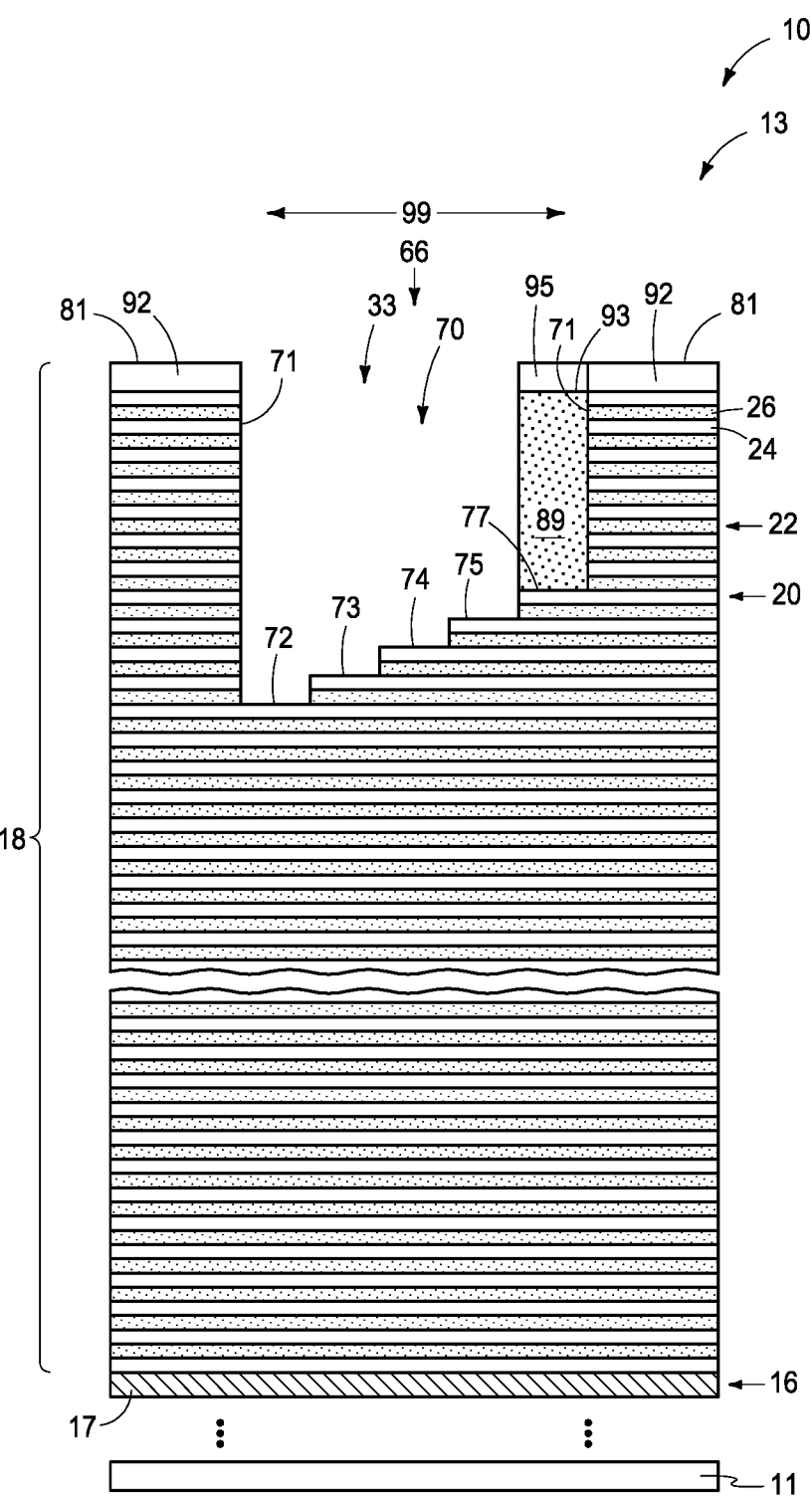

Referring to FIG. 14, masking material 95 (e.g., photoresist) has been formed directly above first and second spacers 93 and 94. Masking material 95 has been formed to comprise an opening 33 there-through that exposes the one of first and second spacers 93 or 94 (93 as shown) that is laterally-closest to one of laterally-opposing outermost sidewalls 71 and covers all remaining of first and second spacers 93 and 94. In the example figures, opening 33 is directly above the far-left of first and second spacers 93 and 94 although of course it could be directly above the far-right one.

FIGS. 15-18 are a series of figures showing use of masking material 95 in a plurality of alternating etching and lateral-trimming steps that widen opening 33 and form multiple different-depth treads 72, 73, 74, 75, and 77 ("depth" herein being in vertical) in individual stairs 70 along second direction 99. The lateral-trimming steps individually expose a next-in-succession of the alternating first and second spacers 93 and 94 through masking material 95 and cover all then-remaining, if any, of first and second spacers 93 and 94 with masking material 95. The etching steps individually remove the respective next-in-succession of the alternating first and second spacers 93 and 94 as a result of the respective lateral-trimming step followed by etching through one of first tiers 22 (at least one) and one of second tiers 20 (at least one) that was there-below. Individual treads 72, 73, 74, 75, and 77 will comprise conducting material of individual first tiers 22 in the finished-circuitry construction. Such is not-yet-shown in the example gate-last processing.

Figure 19:
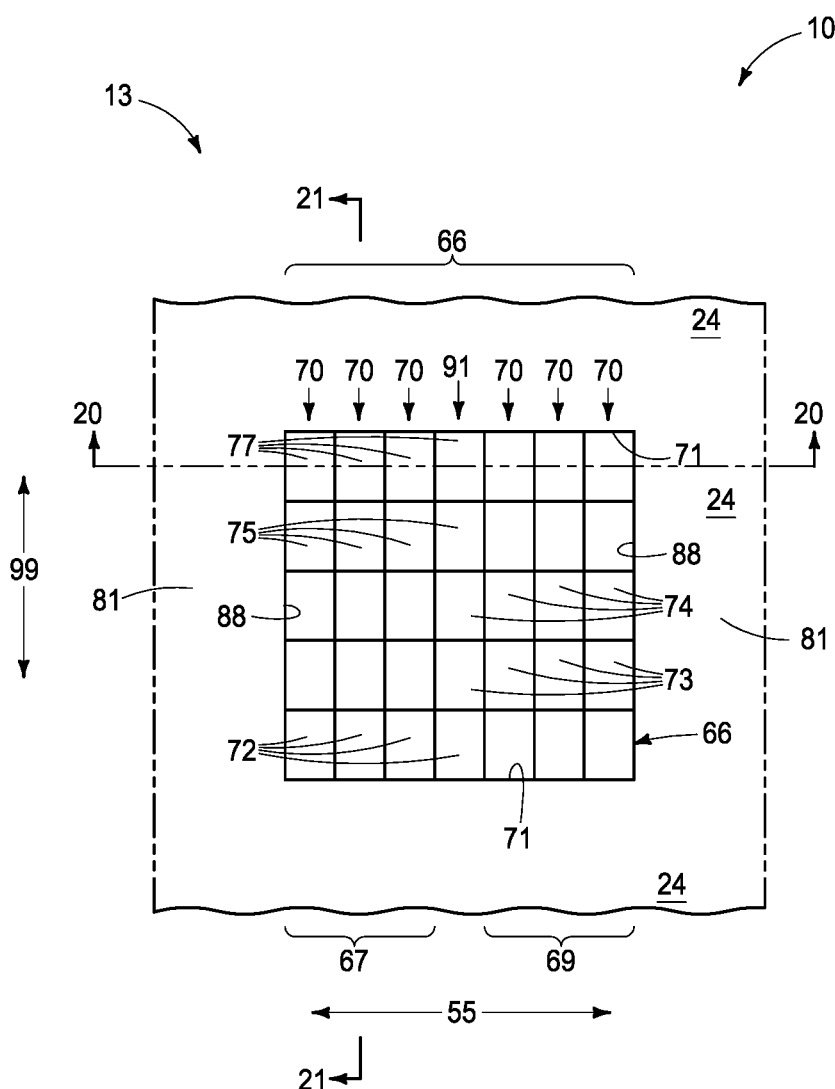
Figure 20:
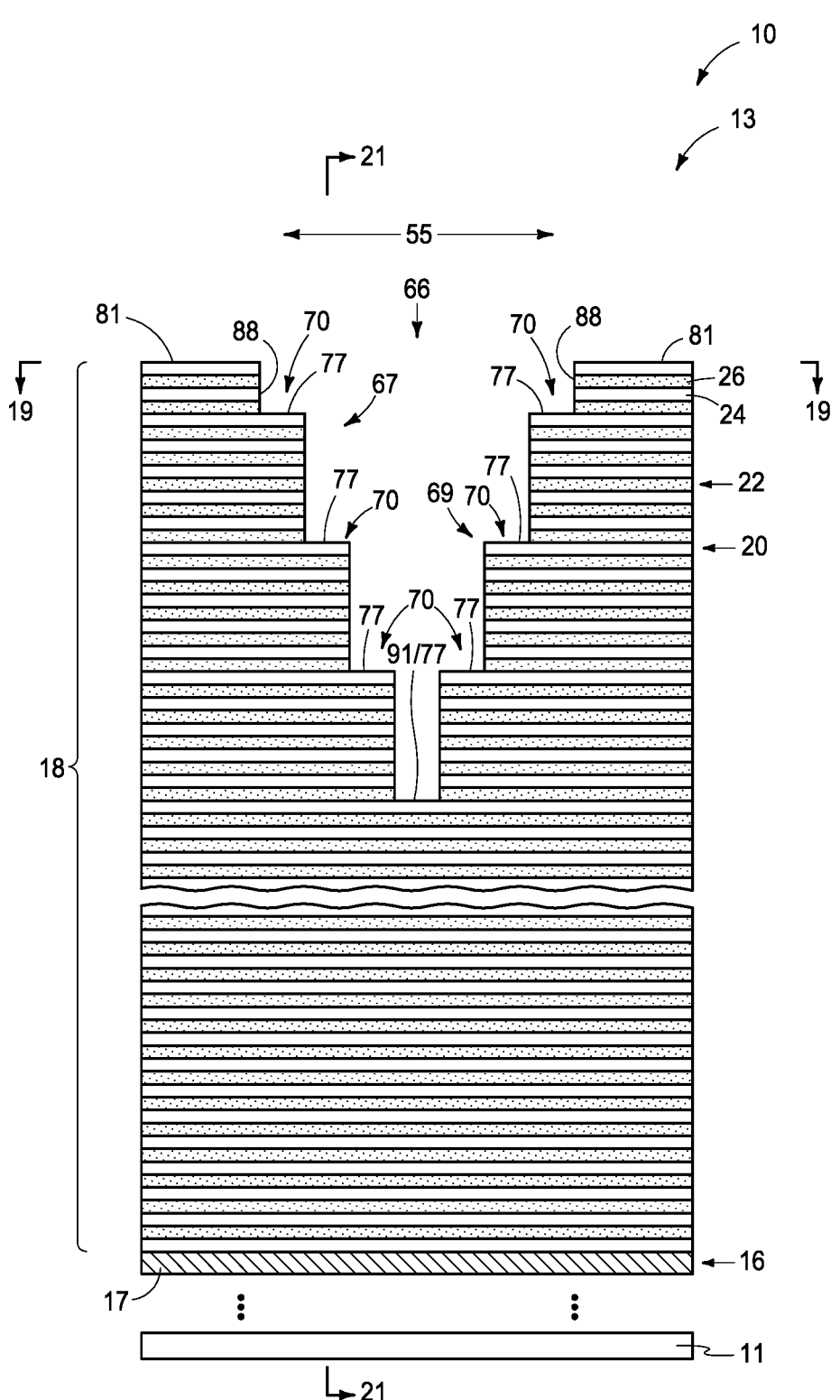
Figure 21:
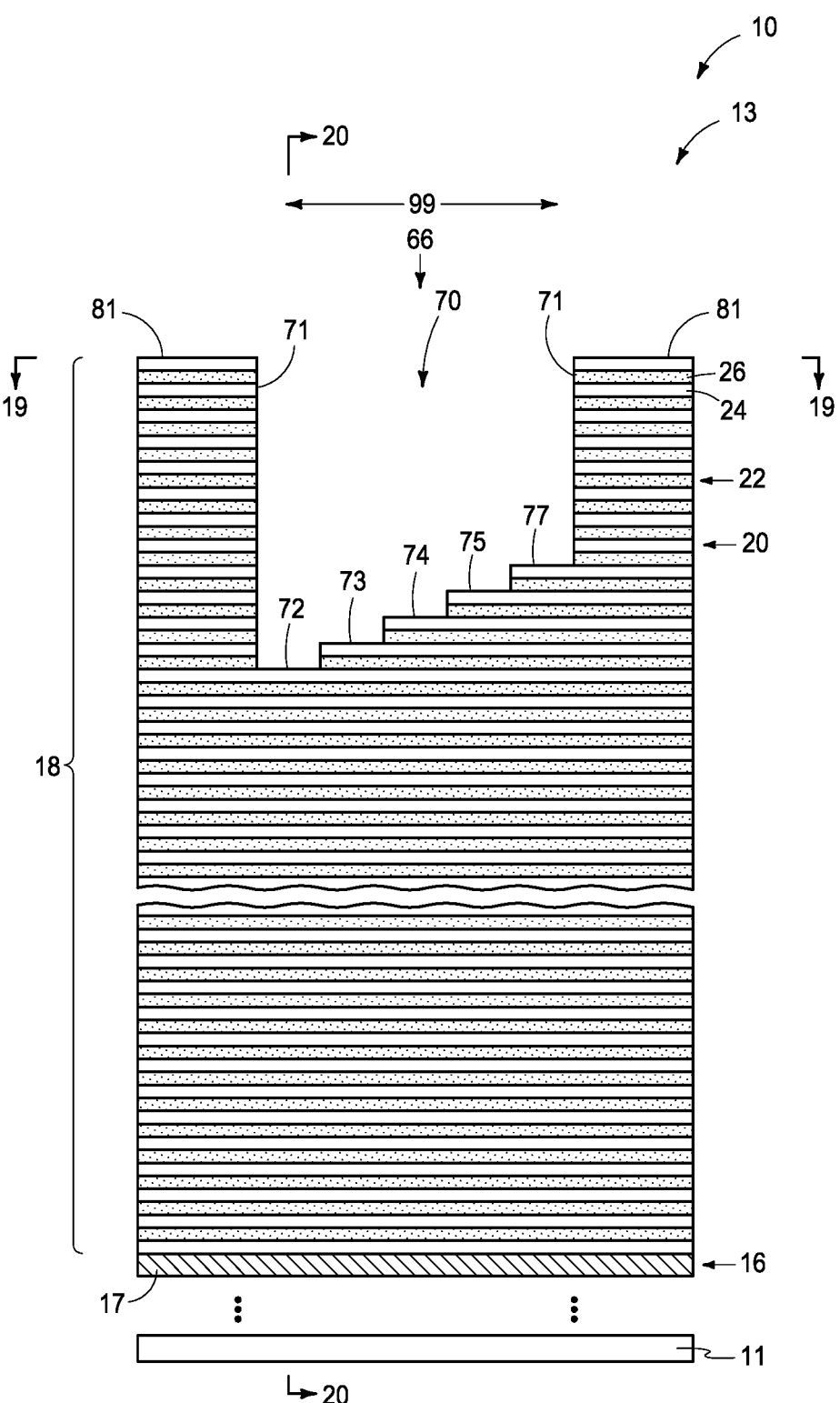
Figure 22:
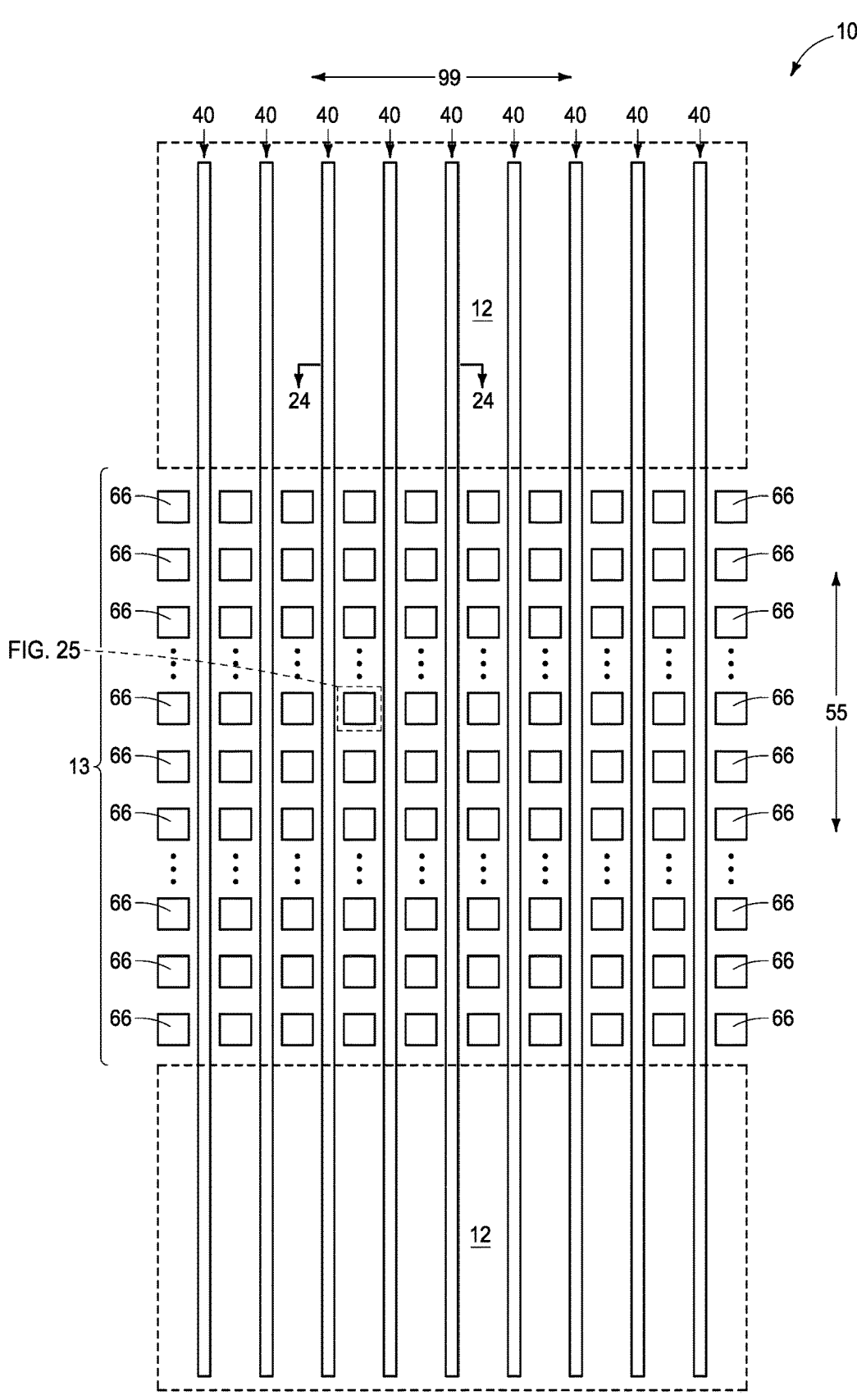
Figures 23, 24:
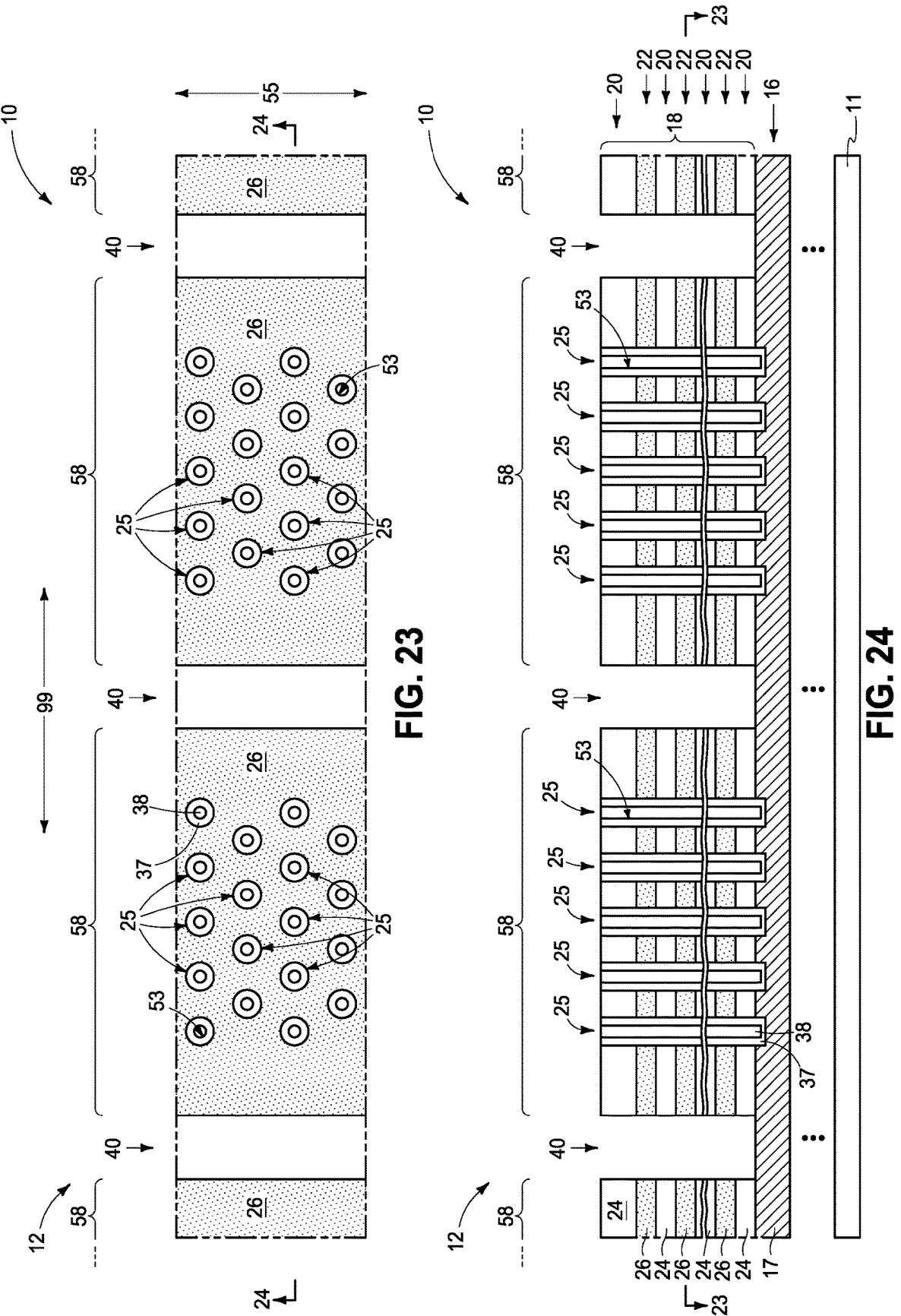
Figure 25:
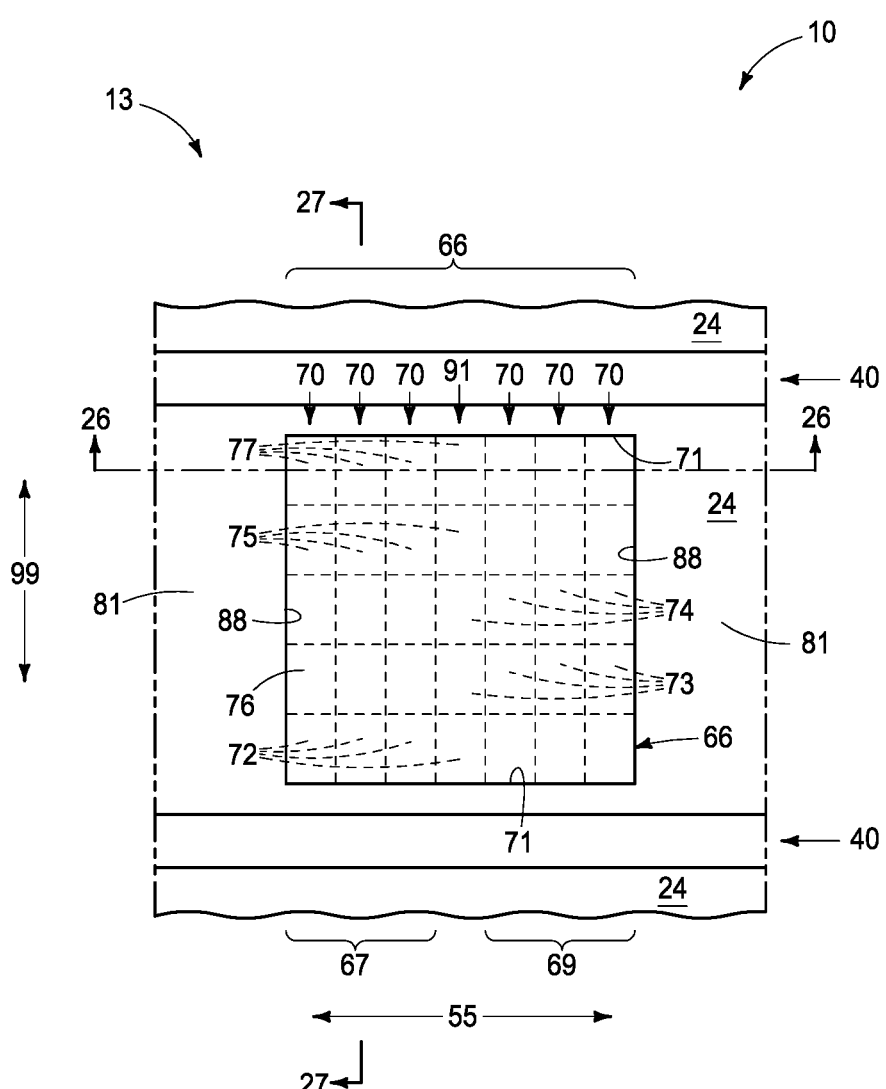
Figure 26:
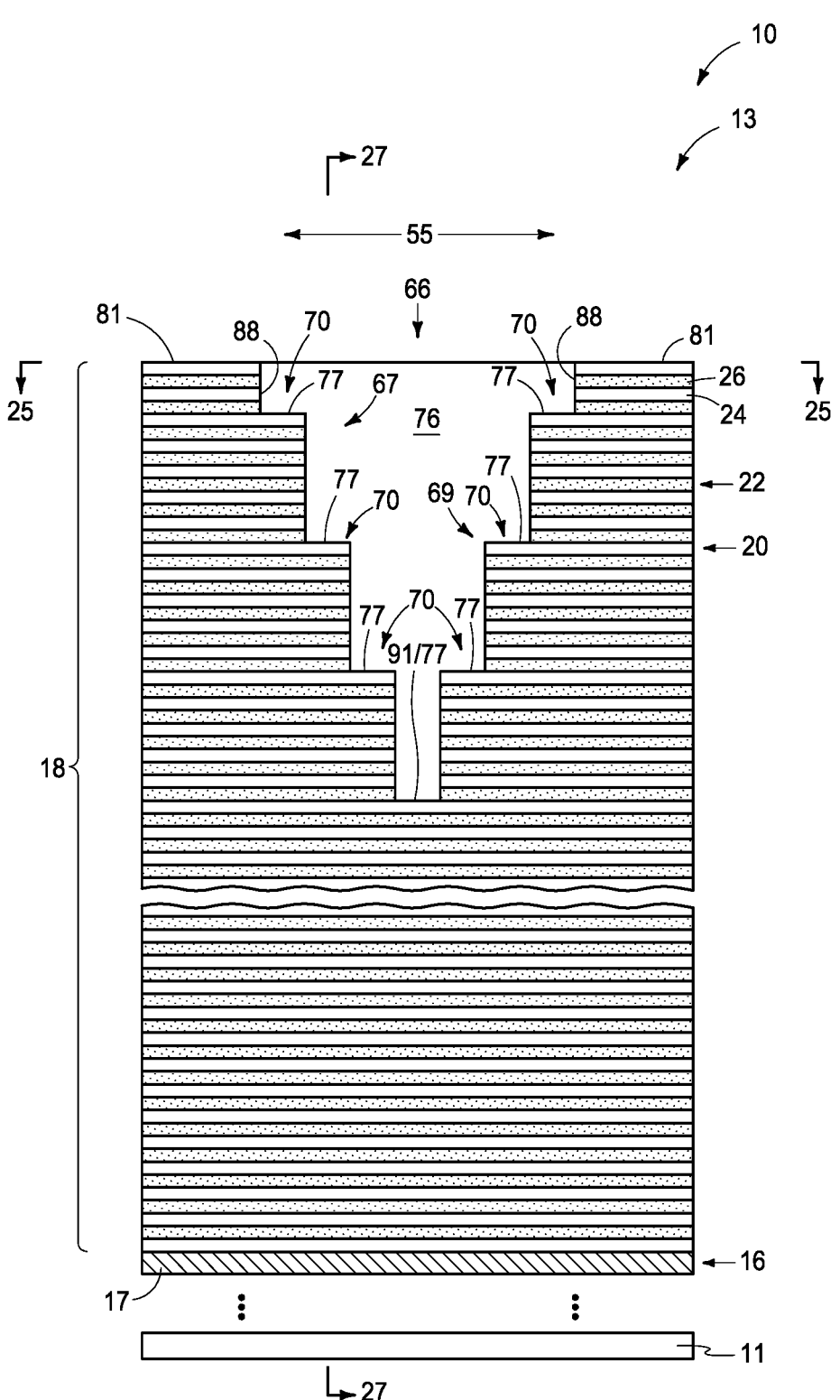
Figure 27:
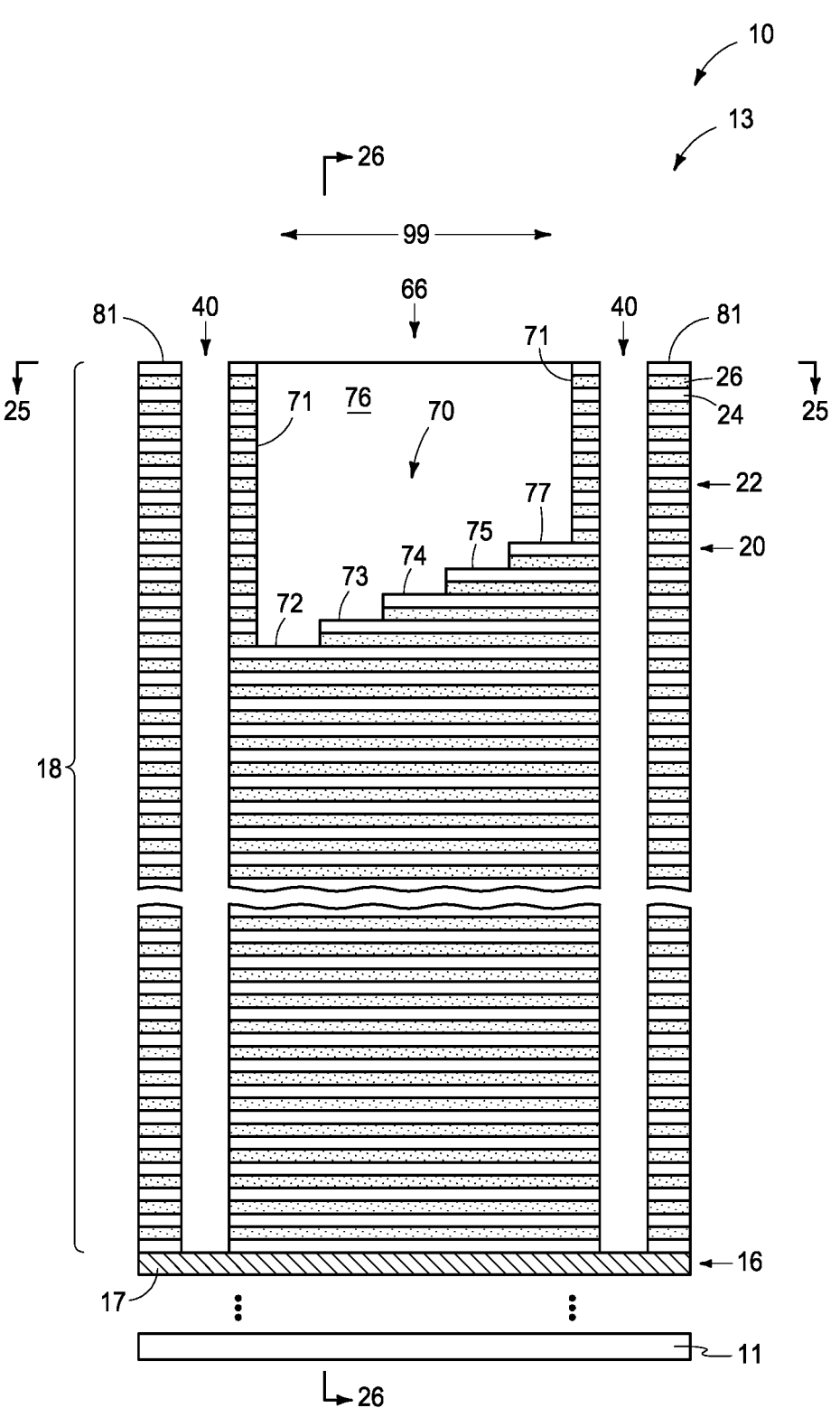
Figure 28:
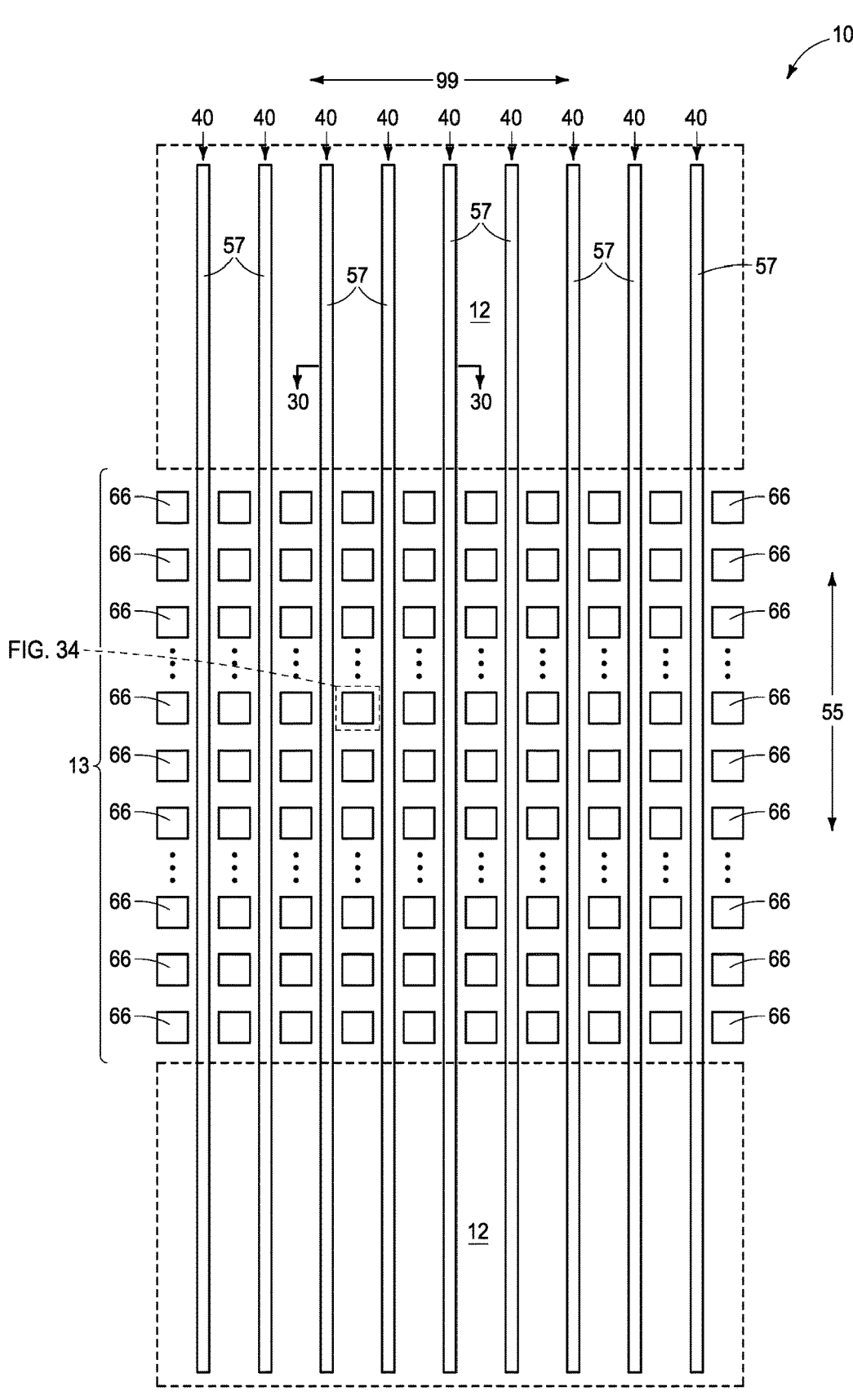
Figures 29, 30:
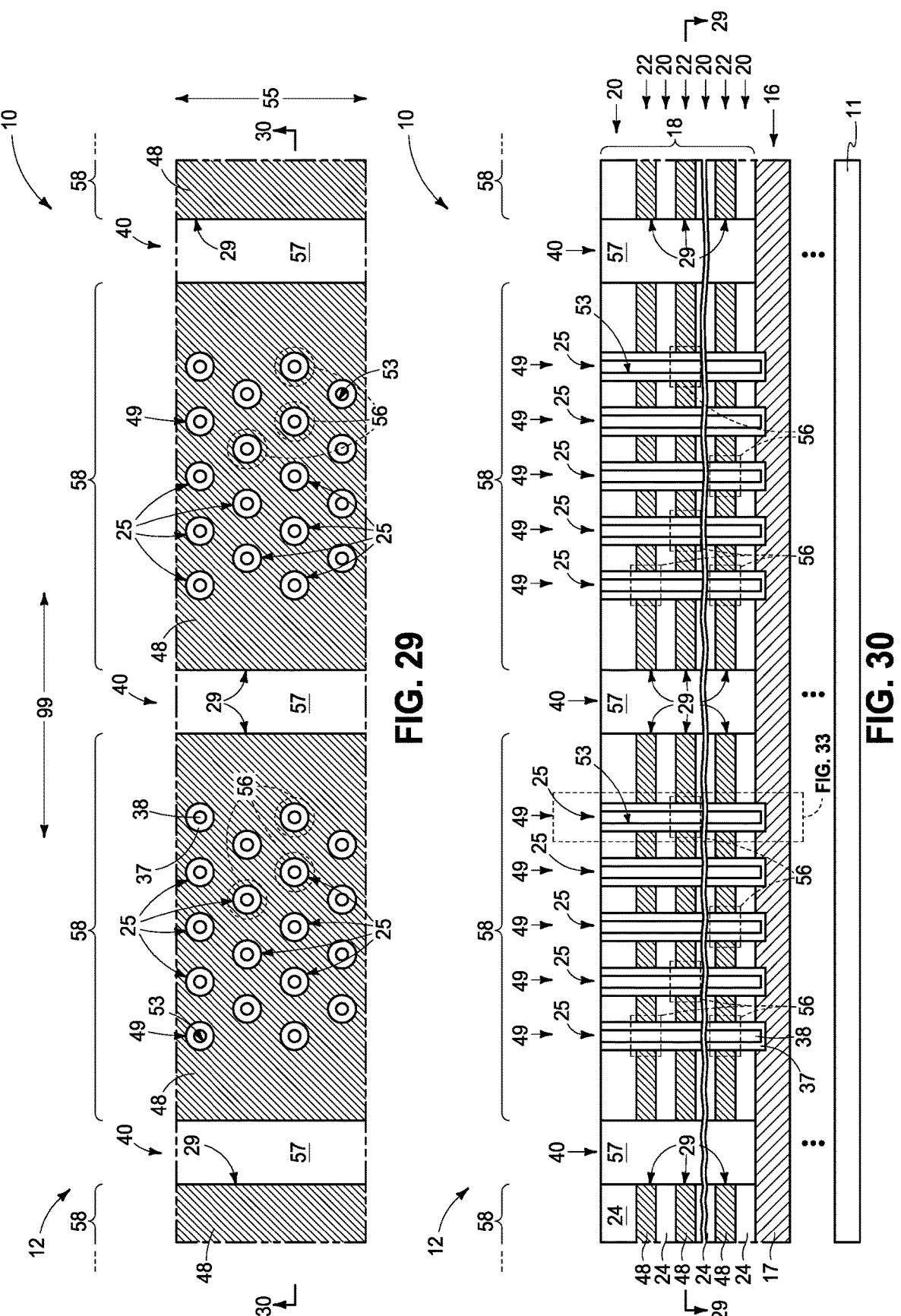
Figure 34:
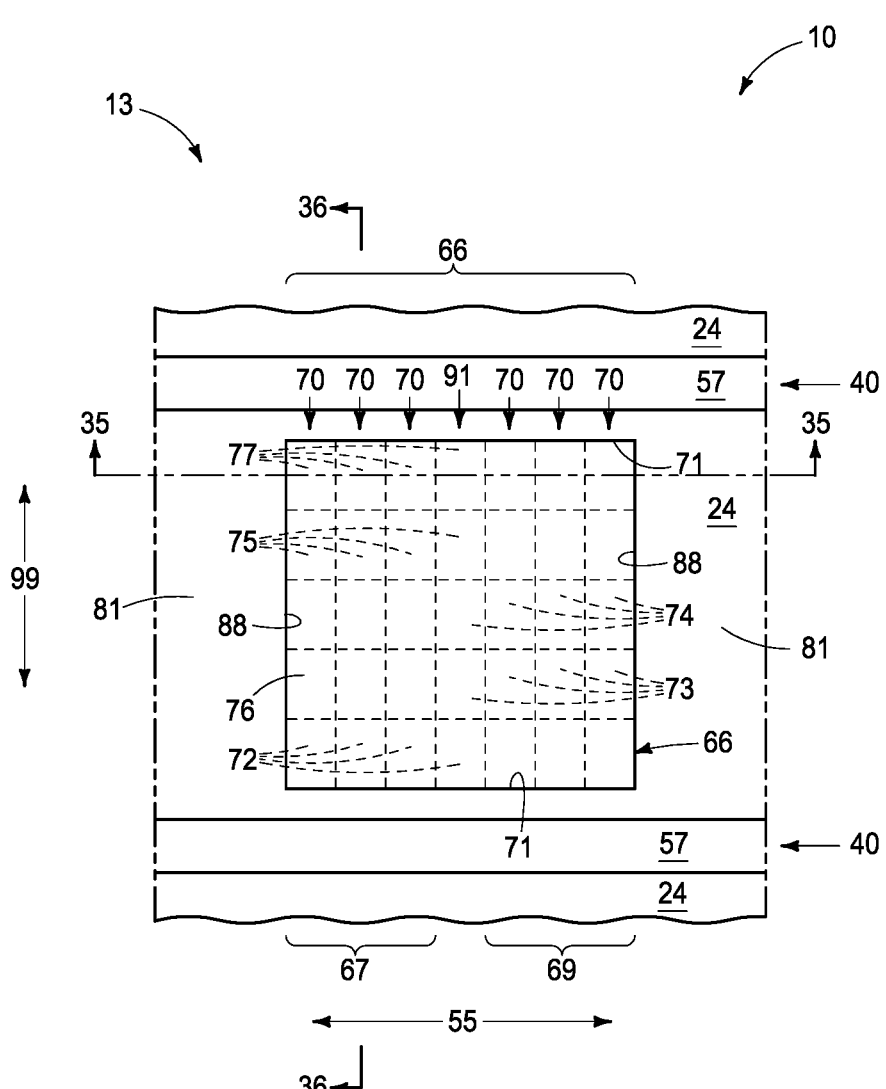
Figure 35:
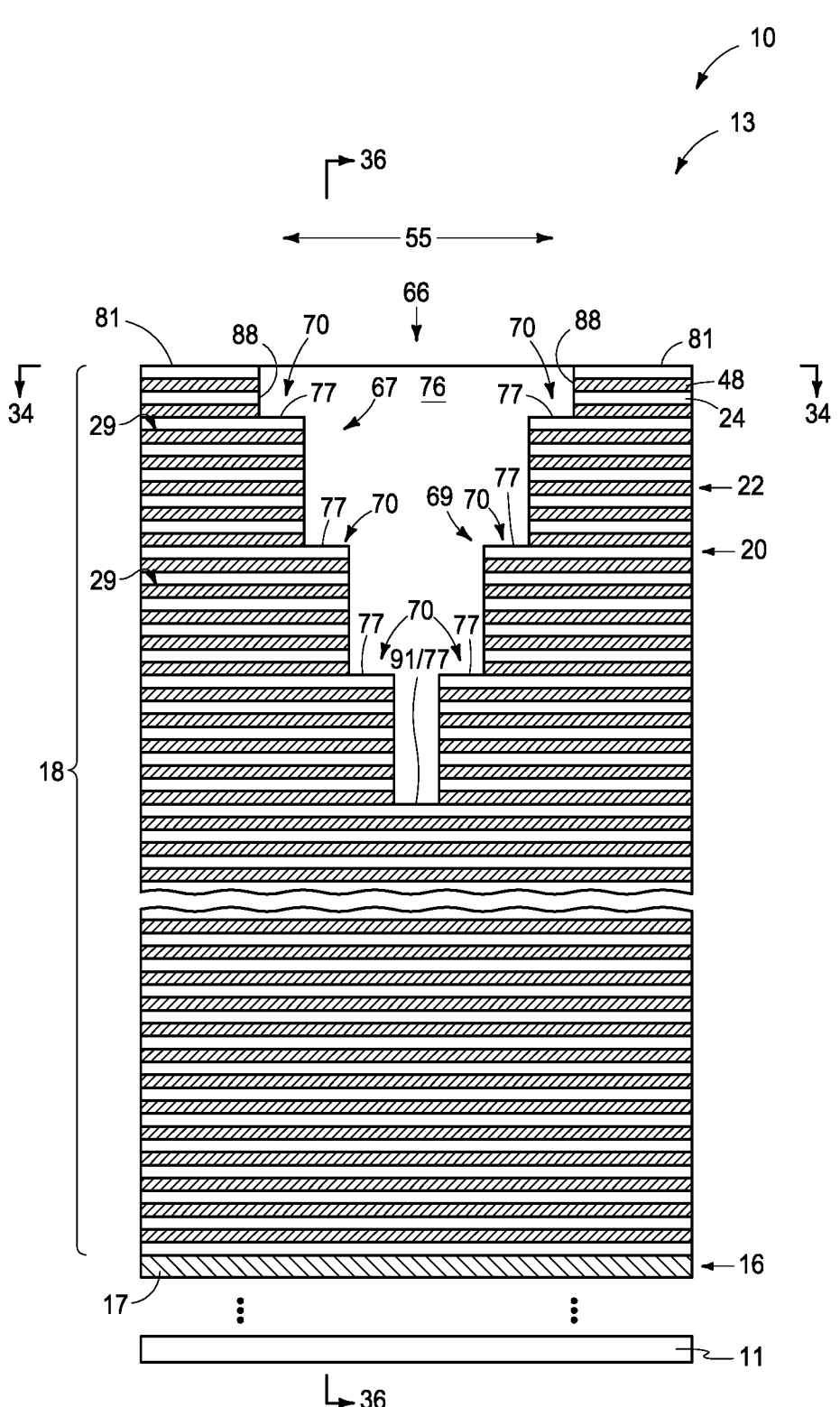
Figure 36:
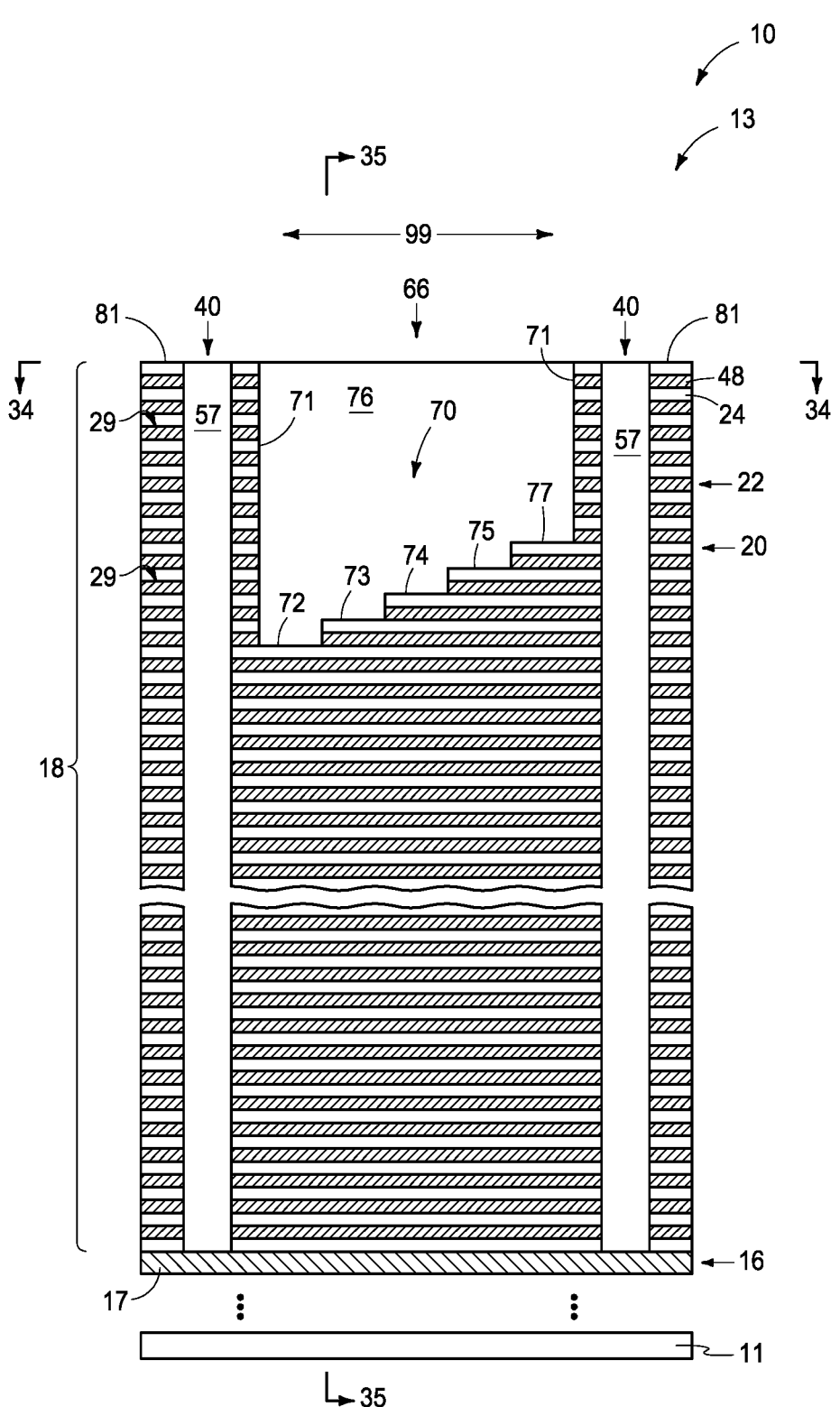

Referring to FIGS. 19-21, the last first spacer 93 (not shown) and masking materials 92 and 95 (not shown) have been removed.

Depending on the circuitry being fabricated, at this point in processing and by way of examples only, one of flights 67 or 69 might be etched deeper into stack 18 compared to the other of flights 67 or 69 while the other is masked (not shown), for example if each of flights 67 and 69 is to be operative in the finished-circuitry construction. Regardless, the flight or flights of stairs in different of multiple cavities 66 may be translated (etched) downwardly at this point in processing (not shown) such that each tread of an operative flight of stairs 70 has its first/conductive tier 22 to be different from other first/conductive tiers 22.

Referring to FIGS. 22-27, insulative material 76 has been formed in cavities 66. An example material comprises silicon dioxide atop a silicon nitride lining (no lining being shown). Horizontally-elongated trenches 40 have been formed into stack 18 (e.g., by anisotropic etching) and which are individually between immediately-laterally-adjacent memory-block regions 58. Trenches 40 will typically be wider than channel openings 25 (e.g., 3 to 10 times wider). Trenches 40 may have respective bottoms that are directly against conductor material 17 (e.g., atop or within) of conductor tier 16 (as shown) or may have respective bottoms that are above conductor material 17 of conductor tier 16 (not shown). Trenches 40 may taper laterally-inward and/or outward in vertical cross-section (not shown). Conductive vias to stairs 70 (described below and not-yet-shown) and through-array-vias (TAVs, and not shown) in stair-step region 13 may be formed before or after forming trenches 40. Sidewalls 71 of cavities 66 may be laterally-spaced inwardly from immediately-laterally-adjacent trenches 40 or may not be so spaced, for example depending on whether operative stair flight 67 is directly electrically coupled to only one or to both of two memory-array regions 12.

Referring to FIGS. 28-36, material 26 (not shown) of first tiers 22 has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22 in the example embodiment is sacrificial and has been replaced with conducting material 48, and which has thereafter been removed from trenches 40, thus forming individual conductive lines 29 (e.g., wordlines in stack 18) and elevationally-extending strings 49 of individual transistors and/or memory cells 56 in stack 18.

A thin insulative liner (e.g., $Al_2O_3$ and not shown) may be formed before forming conducting material 48. Approximate locations of transistors and/or memory cells 56 are indicated with a bracket in some figures and some with dashed outlines in some figures, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming channel openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished-circuitry construction. Example insulative materials are one or more of $SiO_2$, $Si_3N_4$, and $Al_2O_3$. Intervening material 57 may include through-array vias (not shown).

Multiple different-depth treads 72, 73, 74, 75, and 77 now individually comprise conducting material 48 of one of conductive tiers 22.

Figure 37:
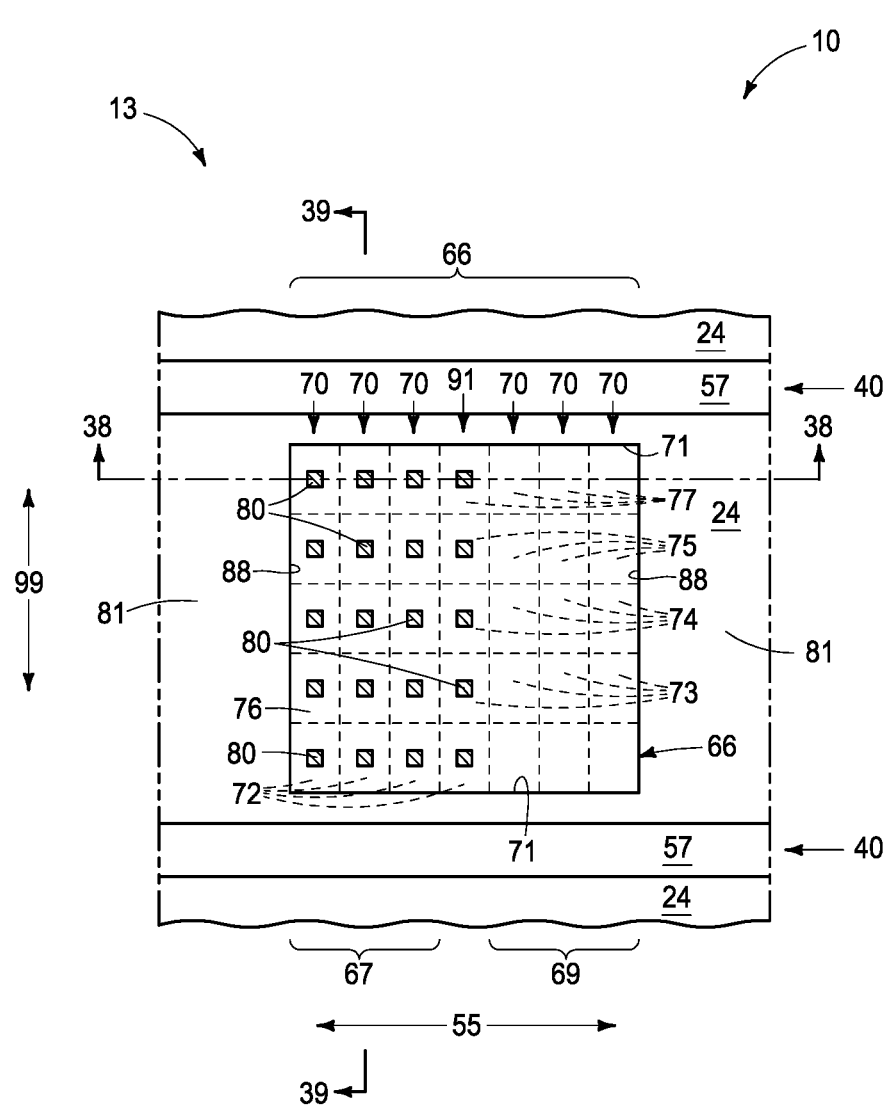
Figure 38:
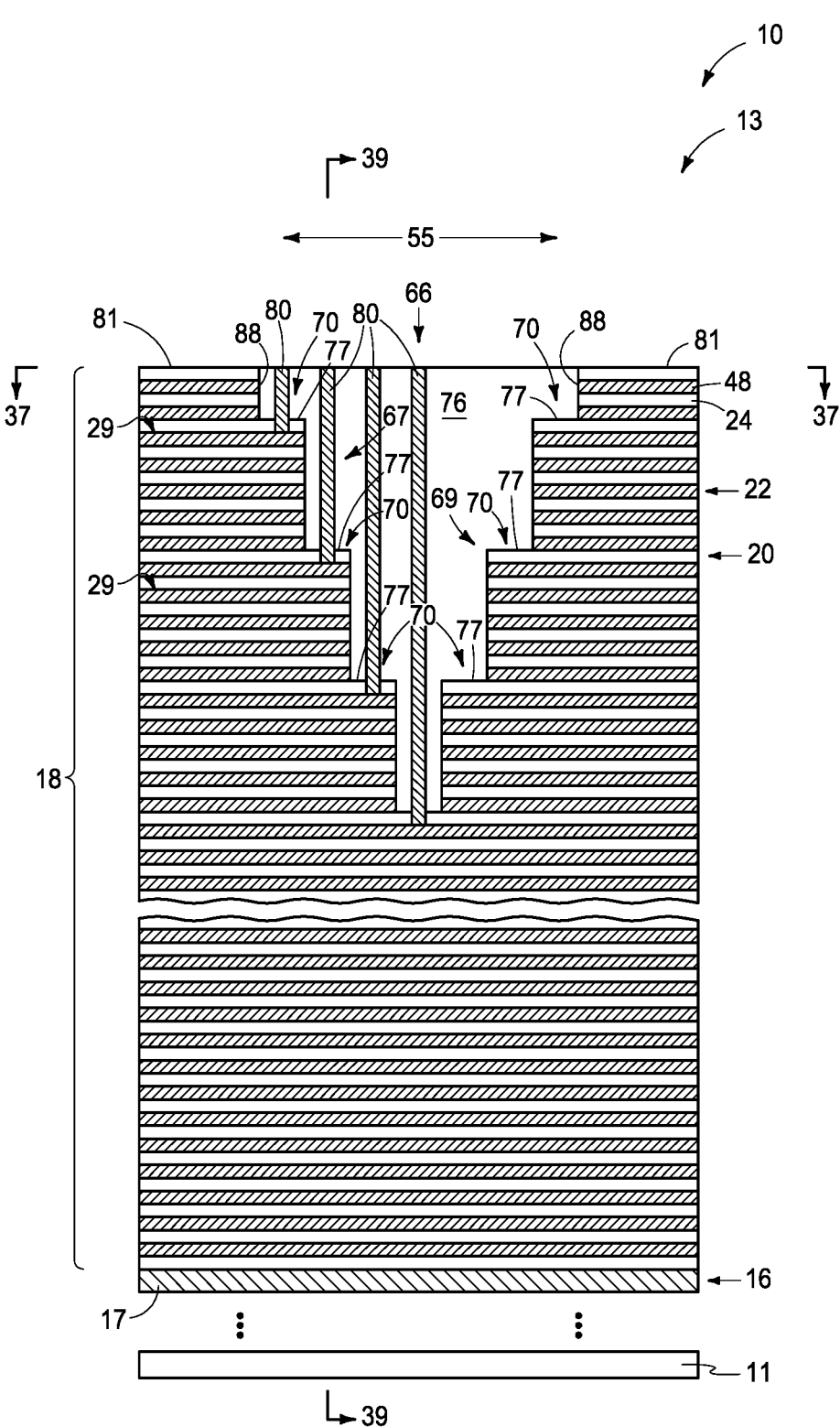
Figure 39:
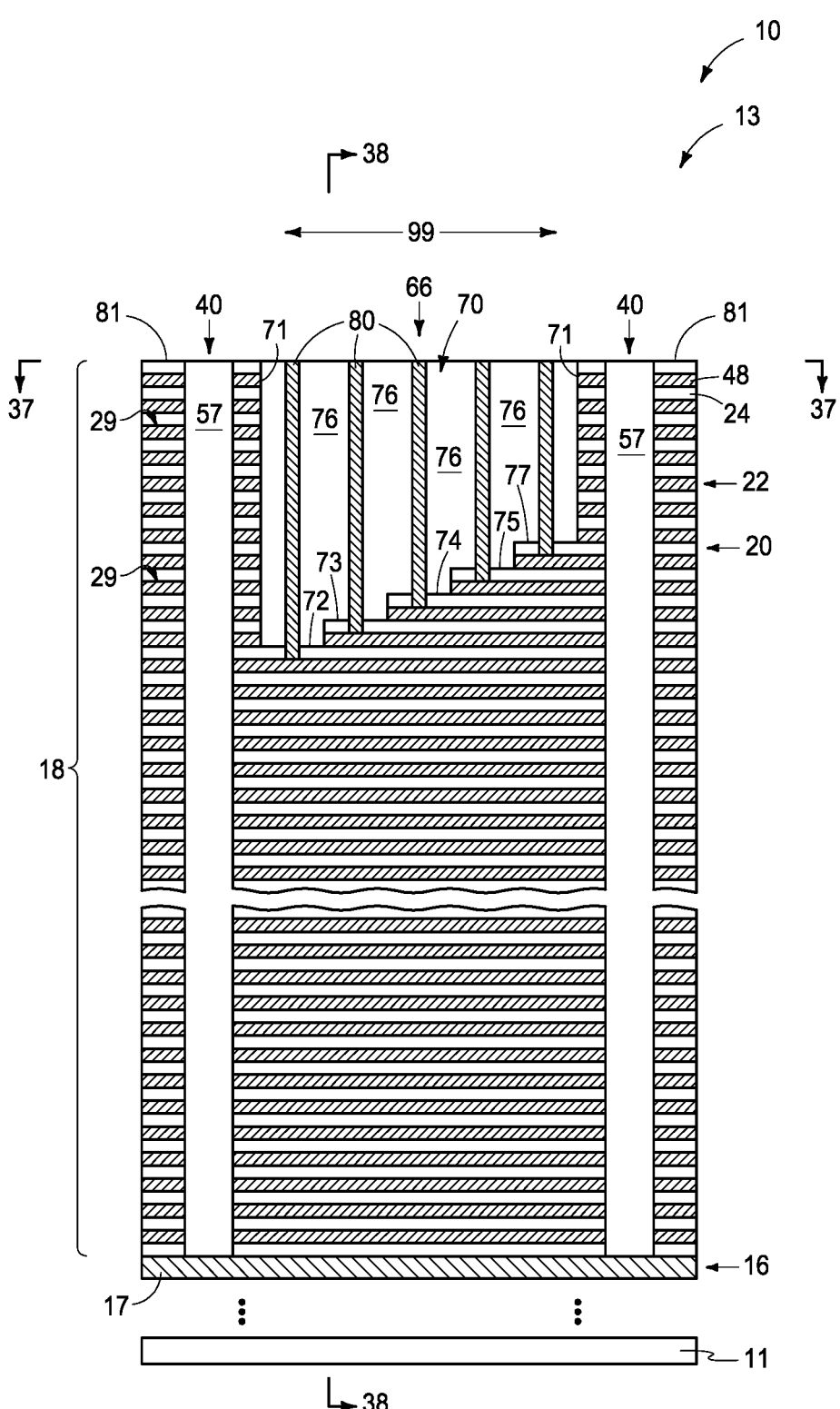

Referring to FIGS. 37-39, conductive vias 80 have been formed (e.g., through insulative material 76) and that are individually directly above and directly against conducting material 48 that is in the respective individual treads 72, 73, 74, 75, and 77. Conductive vias 80 may individually include an insulative lining there-about (not shown). Conductive vias 80 may be routed horizontally (not shown) above stack 18 and connect with individual TAVs (not shown) that extend through stack 18 to circuitry there-below. Such TAVs may extend through intervening material 57 and/or one or more stairs 70 and are not shown in the drawings for clarity as to what is shown and largely directed to aspects of the invention.

In one embodiment and as shown, individual stairs 70 have total number of the multiple different-depth treads 72, 73, 74, 75, and 77 in the finished-circuitry construction that is five. In one embodiment and as shown, the multiple different-depth treads 72, 73, 74, 75, and 77 in the finished-circuitry construction are height-sequential along second direction 99 in individual stairs 70. In one such latter embodiment, the multiple different-depth and height-sequential treads 72, 73, 74, 75, and 77 in individual stairs 70 comprise a single flight of said treads that extends along second direction 99 from one of laterally-opposing outermost sidewalls 71 to the other of laterally-opposing outermost sidewalls 71 (e.g., FIG. 39).

Any other attribute(s) or aspect(s) as shown and/or described herein with respect to other embodiments may be used in the embodiments shown and described with reference to the above embodiments.

In one embodiment, a method used in forming memory circuitry (e.g., 10) comprises forming a stack (e.g., 18) comprising vertically-alternating first tiers (e.g., 22) and second tiers (e.g., 20). The stack extends from a memory-array region (e.g., 12) into a stair-step region (e.g., 13). The stair-step region comprises a cavity (e.g., 66) comprising a flight (e.g., 67 or 69) of stairs (e.g., 70) extending along a first direction (e.g., 55). The first tiers are conductive and the second tiers are insulative at least in a finished-circuitry construction. The cavity comprises a pair of laterally-opposing outermost sidewalls (e.g., 71) relative to a second direction (e.g., 99) that is orthogonal to the first direction and that individually extend along the first direction. Fill material (e.g., material of spacers 93 and 94; e.g., that does not require formation of spacers; e.g., that may be homogenous) has been formed in the cavity directly above the flight of stairs. Masking material (e.g., 95) has been formed directly above the fill material. The masking material comprises an opening (e.g., 33) there-through that exposes a portion (e.g., that above far-left spacer 93 [FIG. 14] or far-right spacer 93 [not shown]) of the fill material that is laterally-closest to one of the laterally-opposing outermost sidewalls and extends there-along in the first direction. The masking material covers all remaining of the fill material but for the portion. The masking material is used in a plurality of alternating etching and lateral-trimming steps (e.g., FIGS. 14-18) that widen the opening and form multiple different-depth treads (e.g., 72, 73, 74, 75, and 77) in individual of the stairs along the second direction. The lateral-trimming steps individually expose a next-in-succession portion of the fill material that extends along the first direction and covers all then-remaining, if any, of the fill material. The etching steps individually remove the respective next-in-succession portion as a result of the respective lateral-trimming step followed by etching through one (at least one) of the first tiers and one of the second tiers (at least one) that was there-below. Individual of the treads comprise conducting material (e.g., 48) of individual of the first tiers in the finished-circuitry construction. Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, memory circuitry (e.g., 10) comprising strings (e.g., 49) of memory cells (e.g., 56) comprises a stack (e.g., 18) comprising vertically-alternating insulative tiers (e.g., 20) and conductive tiers (e.g., 22). Channel-material strings (e.g., 53) of memory cells (e.g., 56) extend through the insulative tiers and the conductive tiers in a memory-array region (e.g., 12). The insulative tiers and the conductive tiers extend from the memory-array region into a stair-step region (e.g., 13). The stair-step region comprises a cavity (e.g., 66) comprising a flight (e.g., 67 or 69) of stairs (e.g., 70) extending along a first direction (e.g., 55). Multiple different-depth and height-sequential treads (e.g., 72, 73, 74, 75, and 77) are in individual of the stairs and extend along a second direction (e.g., 99) that is orthogonal to the first direction. Individual of the multiple different-depth treads comprise conducting material (e.g., 48) of one of the conductive tiers. The cavity comprises a pair of laterally-opposing outermost sidewalls (e.g., 71) relative to the second direction and that individually extend along the first direction. The multiple different-depth and height-sequential treads in the individual stairs comprise a single flight of said treads that extends along the second direction from one of the laterally-opposing outermost sidewalls to the other of the laterally-opposing outermost sidewalls (e.g., FIG. 39). In one embodiment, the individual stairs have total number of the multiple different-depth and height-sequential treads that is five. Any other attribute(s) or aspect(s) as shown and/or described herein with respect to other embodiments may be used.

Using anisotropically-etched spacers at least partially as a mask in forming multiple treads per stair may simplify and reduce masking steps in method aspects of the invention. Forming more than two treads per stair may enable reduction in the number of stadiums (stair-step structures) required to provide access to all wordlines.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming memory circuitry comprises forming a stack comprising vertically-alternating first tiers and second tiers. The stack extends from a memory-array region into a stair-step region. The stair-step region comprises a cavity comprising a flight of stairs extending along a first direction. The first tiers are conductive and the second tiers are insulative at least in a finished-circuitry construction. The cavity comprises a pair of laterally-opposing outermost sidewalls relative to a second direction that is orthogonal to the first direction and that individually extend along the first direction. Different-composition first and second spacers are formed in the cavity and that extend along the first direction directly above the flight of stairs. The first and second spacers alternate relative one another along the second direction. Masking material is formed directly above the first and second spacers. The masking material comprises an opening there-through that exposes the one of the first and second spacers that is laterally-closest to one of the laterally-opposing outermost sidewalls and covers all remaining of the first and second spacers. The masking material is used in a plurality of alternating etching and lateral-trimming steps that widen the opening and form multiple different-depth treads in individual of the stairs along the second direction. The lateral-trimming of the steps individually exposes a next-in-succession of the alternating first and second spacers through the masking material and covers all then-remaining, if any, of the first and second spacers with the masking material. The etching steps individually remove the respective next-in-succession of the alternating first and second spacers as a result of the respective lateral-trimming step followed by etching through one of the first tiers and one of the second tiers that was there-below. Individual of the treads comprise conducting material of individual of the first tiers in the finished-circuitry construction.

In some embodiments, a method used in forming memory circuitry comprises forming a stack comprising vertically-alternating first tiers and second tiers. The stack extends from a memory-array region into a stair-step region. The stair-step region comprises a cavity comprising a flight of stairs extending along a first direction. The first tiers are conductive and the second tiers are insulative at least in a finished-circuitry construction. The cavity comprises a pair of laterally-opposing outermost sidewalls relative to a second direction that is orthogonal to the first direction and that individually extend along the first direction. Fill material is formed in the cavity directly above the flight of stairs. Masking material is formed directly above the fill material. The masking material comprises an opening there-through that exposes a portion of the fill material that is laterally-closest to one of the laterally-opposing outermost sidewalls and extends there-along in the first direction. The masking material covers all remaining of the fill material but for the portion. The masking material is used in a plurality of alternating etching and lateral-trimming steps that widen the opening and form multiple different-depth treads in individual of the stairs along the second direction. The lateral-trimming steps individually expose a next-in-succession portion of the fill material that extends along the first direction and covers all then-remaining, if any, of the fill material. The etching steps individually remove the respective next-in-succession portion as a result of the respective lateral-trimming step followed by etching through one of the first tiers and one of the second tiers that was there-below. Individual of the treads comprise conducting material of individual of the first tiers in the finished-circuitry construction.

In some embodiments, memory circuitry comprising strings of memory cells comprises a stack comprising vertically-alternating insulative tiers and conductive tiers. Channel-material strings of memory cells extend through the insulative tiers and the conductive tiers in a memory-array region. The insulative tiers and the conductive tiers extend from the memory-array region into a stair-step region. The stair-step region comprises a cavity comprising a flight of stairs extending along a first direction. Multiple different-depth and height-sequential treads in individual of the stairs extend along a second direction that is orthogonal to the first direction. Individual of the multiple different-depth treads comprise conducting material of one of the conductive tiers. The cavity comprises a pair of laterally-opposing outermost sidewalls relative to the second direction and that individually extend along the first direction. The multiple different-depth and height-sequential treads in the individual stairs comprise a single flight of said treads that extends along the second direction from one of the laterally-opposing outermost sidewalls to the other of the laterally-opposing outermost sidewalls.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming memory circuitry, comprising:

forming a stack comprising vertically-alternating first tiers and second tiers, the stack extending from a memory-array region into a stair-step region, the stair-step region comprising a cavity comprising a flight of stairs extending along a first direction, the first tiers being conductive and the second tiers being insulative at least in a finished-circuitry construction, the cavity comprising a pair of laterally-opposing outermost sidewalls relative to a second direction that is orthogonal to the first direction and that individually extend along the first direction;

forming a series of first and second spacers in the cavity, the first and second spacers extending along the first direction directly above the flight of stairs, the first spacers having a different composition than the second spacers, the series of spacers having first spacers alternating with second spacers along the second direction;

forming masking material directly above the series of first and second spacers, the masking material comprising an opening there-through that exposes a single spacer of the first and second spacers, the single spacer being laterally-closest to one of the laterally-opposing outermost sidewalls, the masking material covering all remaining of the first and second spacers; and using the masking material in a plurality of alternating etching and lateral-trimming steps that progressively widen the opening and form multiple different-depth treads in individual of the stairs along the second direction, each of the lateral-trimming steps individually exposing a single next-in-series spacer comprised by the series of first and second spacers through the masking material and covering all then-remaining, if any, of the first and second spacers with the masking material, the etching steps individually removing only one of the alternating first and second spacers as a result of the respective lateral-trimming step followed by etching through one of the first tiers and one of the second tiers that was there-below, individual of the treads comprising conducting material of individual of the first tiers in the finished-circuitry construction.

2. The method of claim 1 wherein forming at least some of the series of first and second spacers comprises:

forming a spacer-forming layer above and within the cavity; and anisotropically etching the spacer-forming layer above and within the cavity.

3. The method of claim 2 wherein less-than-all of the spacers are formed by anisotropically etching the respective spacer-forming layer within the cavity.

4. The method of claim 3 wherein a majority of the collective first and second spacers is formed by the anisotropically etching of the respective spacer-forming layer within the cavity.

5. The method of claim 1 wherein the masking material comprises photoresist.

6. The method of claim 1 wherein each of the different compositions is different from those of the first and second tiers.

7. The method of claim 1 wherein one of the different compositions is carbon.

8. The method of claim 1 wherein one of the different compositions is polysilicon.

9. The method of claim 1 wherein one of the different compositions is carbon and the other of the different compositions is polysilicon.

10. The method of claim 1 wherein total number of the alternating first and second spacers in the cavity is five.

11. The method of claim 1 wherein the individual stairs have total number of the multiple different-depth treads in the finished-circuitry construction that is five.

12. The method of claim 1 wherein, total number of the alternating first and second spacers in the series is five; and the individual stairs have total number of the multiple different-depth treads in the finished-circuitry construction that is five.

13. The method of claim 1 wherein the multiple different-depth treads in the finished-circuitry construction are height-sequential along the second direction in the individual stairs.

14. The method of claim 13 wherein the multiple different-depth and height-sequential treads in the individual stairs comprise a single flight of said treads that extends along the second direction from one of the laterally-opposing outermost sidewalls to the other of the laterally-opposing outermost sidewalls.

15. The method of claim 14 wherein the individual stairs have total number of the multiple different-depth treads in the finished-circuitry construction that is five.

16. The method of claim 1 wherein the first and second spacers are of the same lateral-width in the second direction.

17. A method used in forming memory circuitry, comprising:

forming a stack comprising vertically-alternating first tiers and second tiers, the stack extending from a memory-array region into a stair-step region, the stair-step region comprising a cavity comprising a flight of stairs extending along a first direction, the first tiers being conductive and the second tiers being insulative at least in a finished-circuitry construction, the cavity comprising a pair of laterally-opposing outermost sidewalls relative to a second direction that is orthogonal to the first direction and that individually extend along the first direction;

forming fill material in the cavity directly above the flight of stairs;

forming masking material directly above the fill material, the masking material comprising an opening there-through that exposes a portion of the fill material that is laterally-closest to one of the laterally-opposing outermost sidewalls and extends there-along in the first direction, the masking material covering all remaining of the fill material but for the portion; and using the masking material in a plurality of alternating etching and lateral-trimming steps that progressively widen the opening from the laterally-closest sidewall along the first direction and form multiple different-depth treads in individual of the stairs along the second direction, the lateral-trimming steps individually exposing a next-in-succession portion of the fill material that extends along the first direction and covering all then-remaining, if any, of the fill material, the etching steps individually removing the respective next-in-succession portion as a result of the respective lateral-trimming step followed by etching through one of the first tiers and one of the second tiers that was there-below, individual of the treads comprising conducting material of individual of the first tiers in the finished-circuitry construction.

18. The method of claim 17 wherein the masking material comprises photoresist.

19. The method of claim 17 wherein the individual stairs have total number of the multiple different-depth treads that is five.

20. The method of claim 17 wherein the multiple different-depth treads in in the finished-circuitry construction are height-sequential along the second direction in the individual stairs.

21. The method of claim 20 wherein the multiple different-depth and height-sequential treads in the individual stairs comprise a single flight of said treads that extends along the second direction from one of the laterally-opposing outermost sidewalls to the other of the laterally-opposing outermost sidewalls.

22. The method of claim 21 wherein the individual stairs have total number of the multiple different-depth treads in the finished-circuitry construction that is five.

* * * * *